United States Patent
Goto et al.

(10) Patent No.: US 10,186,404 B2
(45) Date of Patent: Jan. 22, 2019

(54) FEPT—C-BASED SPUTTERING TARGET AND METHOD FOR MANUFACTURING SAME

(71) Applicant: Tanaka Kikinzoku Kogyo K.K., Tokyo (JP)

(72) Inventors: Yasuyuki Goto, Tsukuba (JP); Takamichi Yamamoto, Tsukuba (JP); Masahiro Nishiura, Tsukuba (JP); Ryousuke Kushibiki, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 564 days.

(21) Appl. No.: 14/770,868

(22) PCT Filed: Jan. 31, 2014

(86) PCT No.: PCT/JP2014/052341
§ 371 (c)(1),
(2) Date: Aug. 27, 2015

(87) PCT Pub. No.: WO2014/132746
PCT Pub. Date: Sep. 4, 2014

(65) Prior Publication Data
US 2016/0013033 A1 Jan. 14, 2016

(30) Foreign Application Priority Data

Mar. 1, 2013 (JP) .................................. 2013-041325
Mar. 2, 2013 (JP) .................................. 2013-041338

(51) Int. Cl.
*C23C 14/34* (2006.01)
*H01J 37/34* (2006.01)
(Continued)

(52) U.S. Cl.
CPC ........ *H01J 37/3429* (2013.01); *B22F 1/0059* (2013.01); *B22F 3/14* (2013.01);
(Continued)

(58) Field of Classification Search
CPC .......... B22F 1/0059; B22F 3/14; C22C 26/00; C22C 32/0084; C22C 5/04; C23C 14/3414; G11B 5/653; G11B 5/851; H01J 37/3429
(Continued)

(56) References Cited

U.S. PATENT DOCUMENTS

| | | | |
|---|---|---|---|
| 6,406,600 B1 | 6/2002 | Takashima | |
| 8,858,674 B2 * | 10/2014 | Miyashita | ................. C22C 5/04 204/298.13 |
| 2013/0306470 A1 | 11/2013 | Ogino et al. | |

FOREIGN PATENT DOCUMENTS

| | | |
|---|---|---|
| CN | 101220457 A | 7/2008 |
| CN | 102333905 A | 1/2012 |

(Continued)

OTHER PUBLICATIONS

PCT, International Preliminary Report on Patentability for PCT/JP2014/052341, dated Sep. 3, 2015.
(Continued)

*Primary Examiner* — Rodney G McDonald
(74) *Attorney, Agent, or Firm* — Orrick, Herrington & Sutcliffe LLP; Joseph A. Calvaruso

(57) ABSTRACT

An FePt—C-based sputtering target containing Fe, Pt, and C, wherein the FePt—C-based sputtering target has a structure in which primary particles of C that contain unavoidable impurities are dispersed in an FePt-based alloy phase containing 33 at % or more and 60 at % or less of Pt with the balance being Fe and unavoidable impurities, the primary particles of C being dispersed so as not to be in contact with each other.

21 Claims, 5 Drawing Sheets

(51) Int. Cl.
  *B22F 3/14*   (2006.01)
  *C22C 5/04*   (2006.01)
  *G11B 5/851*  (2006.01)
  *G11B 5/65*   (2006.01)
  *C22C 26/00*  (2006.01)
  *C22C 32/00*  (2006.01)
  *B22F 1/00*   (2006.01)

(52) U.S. Cl.
  CPC ............... *C22C 5/04* (2013.01); *C22C 26/00* (2013.01); *C22C 32/0084* (2013.01); *C23C 14/3414* (2013.01); *G11B 5/653* (2013.01); *G11B 5/851* (2013.01)

(58) Field of Classification Search
  USPC ...................................... 204/298.12, 298.13
  See application file for complete search history.

(56) References Cited

FOREIGN PATENT DOCUMENTS

| | | |
|---|---|---|
| JP | 10-140265 A | 5/1998 |
| JP | 3950838 B | 8/2007 |
| JP | 2011-208167 A | 10/2011 |
| JP | 2012-102387 A | 5/2012 |
| JP | 2012-178210 A | 9/2012 |
| JP | 2012-214874 A | 11/2012 |
| TW | 2013-00559 A1 | 1/2013 |
| WO | WO 2012/073882 A1 | 6/2012 |
| WO | WO 2012/086335 A1 | 6/2012 |
| WO | WO 2012/105201 A1 | 8/2012 |
| WO | WO 2012/132939 A1 | 10/2012 |
| WO | WO 2012-133166 A1 | 10/2012 |
| WO | WO 2013-190943 A1 | 12/2013 |

OTHER PUBLICATIONS

JP, Japanese Information Offer Form regarding corresponding Japanese Application No. JP 2015-502823 and a machine translation of the IOF, May 16, 2016.

SG, Invitation to respond to written opinion, search report and written opinion, dated Aug. 4, 2016.

JP, Japanese Information Offer Form regarding corresponding Japanese Application No. JP 2015-502823, Jan. 6, 2016.

PCT, International Search Report PCT/JP2014/052341, dated May 13, 2014.

JP, Japanese Information Offer Form regarding corresponding Japanese Patent Application No. 2015-502823, Oct. 16, 2013.

* cited by examiner

FEPT—C-BASED SPUTTERING TARGET AND METHOD FOR MANUFACTURING SAME

TECHNICAL FIELD

The present invention relates to a FePt—C-based sputtering target and to a method for manufacturing the same.

BACKGROUND ART

An FePt alloy can be provided with the fct (Ordered Face Centered Tetragonal) structure which has high crystal magnetic anisotropy by heat-treating at an elevated temperature (for example, at 600° C. or higher), and therefore an FePt alloy has been highlighted as a magnetic recording medium. To make FePt particles smaller and more uniform in the thin film of the FePt alloy, it is proposed that a predetermined quantity of carbon (C) be included into the thin film of the FePt alloy (for example, Patent Literature 1).

However, the formation method of the FePtC thin film, described in the Patent Literature 1, is the method of vapor-depositing Fe, Pt, and C simultaneously on an MgO (100) substrate by using the Fe target of a 2-inch diameter, C target of a 2-inch diameter, and the Pt target of 5 mm in height and width. In this method, it is difficult to obtain the film whose composition is controlled strictly. Additionally, three targets are required and each target needs a cathode, a power supply, etc, and so the cost of equipment becomes high while the preparatory work of sputtering takes time and effort.

In contrast, Patent Literature 2 discloses an FePt—C-based sputtering target that alone can be used to form an FePtC-based thin film without using a plurality of targets and also discloses a method for manufacturing the FePt—C-based sputtering target. Patent Literature 3 discloses an FePt—C-based sputtering target that alone can be used to form an FePtC-based thin film containing a large amount of carbon without using a plurality of targets and also discloses a method for manufacturing the sputtering target.

Patent Literature 4 discloses a sputtering target for forming a magnetic recording medium film. This target contains $SiO_2$ instead of carbon (C) and is formed of a sintered body having a composition represented by a general formula: $(Fe_xPt_{(100-x)})_{(100-y)}(SiO_2)_y$, wherein $40 \leq x \leq 60$ (unit: % by mole) and $5 \leq y \leq 30$ (unit: % by mole). The sputtering target is characterized in that its structure is composed of an $SiO_2$ phase, an FePt alloy phase formed of a solid solution of Fe and Pt, and an interdiffusion phase that contains Si, O, Fe, and Pt and is formed by interdiffusion of these elements Si, O, Fe, and Pt at the boundary between the $SiO_2$ phase and the FePt alloy phase.

As described above, some sputtering targets have been proposed, each of which alone can be used to form a thin film containing an FePt-based alloy that is receiving attention as a novel magnetic recording medium.

However, it is generally required for a sputtering target to cause a reduced amount of particles during sputtering. This is also required for a sputtering target that alone may be used to form a thin film containing an FePt-based alloy.

CITATION LIST

Patent Literature

Patent Literature 1: Japanese Patent No. 3950838
Patent Literature 2: Japanese Patent Application Laid-Open Publication No. 2012-102387
Patent Literature 3: Japanese Patent Application Laid-Open Publication No. 2012-214874
Patent Literature 4: Japanese Patent Application Laid-Open Publication No. 2011-208167

SUMMARY OF INVENTION

Technical Problem

The present invention has been made in view of the foregoing circumstances, and it is an object to provide an FePt—C-based sputtering target that alone can be used to form a thin film containing an FePt-based alloy and capable of being used as a magnetic recording medium without using a plurality of targets and that causes a reduced amount of particles during sputtering. It is another object to provide a method for manufacturing the FePt—C-based sputtering target.

As a result of intensive research to achieve the aforementioned object, the present inventors found out that the aforementioned object is achievable by the following FePt—C-based sputtering targets and achievable by the following method for manufacturing the FePt—C-based sputtering target, and the present inventors created the present invention.

Namely, a first aspect of an FePt—C-based sputtering target according to the present invention is an FePt—C-based sputtering target containing Fe, Pt, and C, wherein the FePt—C-based sputtering target has a structure in which primary particles of C that contain unavoidable impurities are dispersed in an FePt-based alloy phase containing 33 at % or more and 60 at % or less of Pt with the balance being Fe and unavoidable impurities, the primary particles of C being dispersed so as not to be in contact with each other.

In the present description, the term "FePt-based alloy" means an alloy containing Fe and Pt as main components and is intended to encompass not only a binary alloy containing only Fe and Pt but also ternary and higher alloys containing Fe and Pt as main components and an additional metal element(s) other than Fe and Pt. The term "FePt—C-based sputtering target" means a sputtering target containing Fe, Pt, and C as main components and is intended to encompass a sputtering target further containing an element other than the main components Fe, Pt, and C. The term "FePtC-based thin film" means a thin film containing Fe, Pt, and C as main components and is intended to encompass a thin film further containing an element other than the main components Fe, Pt, and C. The term "FePtC-based layer" means a layer containing Fe, Pt, and C as main components and is intended to encompass a layer further containing an element other than the main components Fe, Pt, and C.

A second aspect of an FePt—C-based sputtering target according to the present invention is an FePt—C-based sputtering target containing Fe, Pt, and C and further containing at least one metal element other than Fe and Pt, wherein the FePt—C-based sputtering target has a structure in which primary particles of C that contain unavoidable impurities are dispersed in an FePt-based alloy phase containing 33 at % or more and less than 60 at % of Pt and more than 0 at % and 20 at % or less of the at least one metal element other than Fe and Pt with the balance being Fe and unavoidable impurities and with the total amount of Pt and the at least one metal element being 60 at % or less, the primary particles of C being dispersed so as not to be in contact with each other.

In the second aspect of an FePt—C-based sputtering target according to the present invention, the one or more kinds of metal elements other than Fe and Pt may be one or more kinds of Cu, Ag, Mn, Ni, Co, Pd, Cr, V, and B.

The primary particles preferably have an average size of 1 μm or more and 30 μm or less.

From the viewpoint of reducing the number of particles generated during sputtering, the crystal structure of the primary particles of C is preferably an amorphous structure or a diamond structure.

Preferably, a volume fraction of the C relative to a total volume of the target is 5 vol % or more and 60 vol % or less. Preferably, a ratio of a surface area of the C that is covered with the FePt-based alloy phase to a total surface area of the C is 80% or more.

An oxide phase may be further dispersed in the FePt-based alloy phase. In this case, it is preferable that the volume fraction of the C relative to the total volume of the target be 5 vol % or more and less than 60 vol %, that the volume fraction of the oxide phase relative to the total volume of the target be 3 vol % or more and less than 55 vol %, and that the sum of the volume fractions of the C and the oxide phase relative to the total volume of the target be 8 vol % or more and 60 vol % or less.

The oxide phase may contain at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

The primary particles of C have, for example, an approximately spherical shape in which a value obtained by dividing its major axis by its minor axis is 2 or less.

Preferably, the FePt—C-based sputtering target has a relative density of 90% or larger.

A first aspect of a method for manufacturing an FePt—C-based sputtering target according to the present invention is a method for manufacturing an FePt—C-based sputtering target, the method including: adding a C powder composed of primary particles containing unavoidable impurities and not forming secondary particles to an FePt-based alloy powder having an average particle diameter of 20 μm or less and containing 33 at % or more and 60 at % or less of Pt with the balance being Fe and unavoidable impurities; mixing the C powder and the FePt-based alloy powder such that a primary particle diameter of the C powder is not essentially reduced to thereby produce a powder mixture for pressure sintering; and then molding the produced powder mixture for pressure sintering while the powder mixture is heated under application of pressure.

The phrase "mixing the C powder and the FePt-based alloy powder such that a primary particle diameter of the C powder is not essentially reduced" means that the C powder and the FePt-based alloy powder are mixed such that the mixing does not cause a reduction in the primary particle diameter of the C powder, the reduction causing an increase in the number of particles generated. This concept is intended to encompass mixing that causes the primary particle diameter of the C powder to decrease to some extent but does not cause the number of particles generated to increase.

A second aspect of a method for manufacturing an FePt—C-based sputtering target according to the present invention is a method for manufacturing an FePt—C-based sputtering target, the method including: weighing a Pt powder containing unavoidable impurities and having an average particle diameter of 20 μm or less and an Fe powder containing unavoidable impurities and having an average particle diameter of 20 μm or less such that a ratio of an amount of the Pt to a total amount of the Fe and the Pt is 33 at % or more and 60 at % or less; mixing the weighed Pt powder, the weighed Fe powder, and a C powder composed of primary particles containing unavoidable impurities and not forming secondary particles such that a primary particle diameter of the C powder is not essentially reduced to thereby produce a powder mixture for pressure sintering; and then molding the produced powder mixture for pressure sintering while the powder mixture is heated under application of pressure.

In the present description, the Pt powder may be denoted as a single Pt powder, and the Fe powder may be denoted as a single Fe powder.

A third aspect of a method for manufacturing an FePt—C-based sputtering target according to the present invention is a method for manufacturing an FePt—C-based sputtering target, the method including: adding a C powder composed of primary particles containing unavoidable impurities and not forming secondary particles to an FePt-based alloy powder having an average particle diameter of 20 μm or less and containing 33 at % or more and less than 60 at % of Pt and more than 0 at % and 20 at % or less of at least one metal element other than Fe and Pt with the balance being Fe and unavoidable impurities and with a total amount of Pt and the at least one metal element being 60 at % or less; mixing the C powder and the FePt-based alloy powder such that the primary particle diameter of the C powder is not essentially reduced to thereby produce a powder mixture for pressure sintering; and then molding the produced powder mixture for pressure sintering while the powder mixture is heated under application of pressure.

A fourth aspect of a method for manufacturing an FePt—C-based sputtering target according to the present invention is a method for manufacturing an FePt—C-based sputtering target, the method including: weighing an FePt-based alloy powder composed of Pt, Fe, and unavoidable impurities and having an average particle diameter of 20 μm or less and a metal powder containing at least one metal element other than Fe and Pt with the balance being unavoidable impurities and having an average particle diameter of 20 μm or less such that a ratio of an amount of the Pt to a total amount of the Pt, the Fe, and the at least one metal element is 33 at % or more and less than 60 at %, a ratio of an amount of the at least one metal element to the total amount is more than 0 at % and 20 at % or less, and a ratio of a sum of the amounts of the Pt and the at least one metal element to the total amount is 60 at % or less; mixing the weighed FePt-based alloy powder, the weighed metal powder containing the at least one metal element, and a C powder composed of primary particles containing unavoidable impurities and not forming secondary particles such that a primary particle diameter of the C powder is not essentially reduced to thereby produce a powder mixture for pressure sintering; and then molding the produced powder mixture for pressure sintering while the powder mixture is heated under application of pressure.

A fifth aspect of a method for manufacturing an FePt—C-based sputtering target according to the present invention is a method for manufacturing an FePt—C-based sputtering target, the method including: weighing a Pt powder containing unavoidable impurities and having an average particle diameter of 20 μm or less, an Fe powder containing unavoidable impurities and having an average particle diameter of 20 μm or less, and a metal powder containing at least one metal element other than Fe and Pt with the balance being unavoidable impurities and having an average particle diameter of 20 μm or less such that a ratio of an amount of the Pt to a total amount of the Pt, the Fe, and the at least one metal element is 33 at % or more and less than 60 at %, a ratio of an amount of the at least one metal element to the total amount is more than 0 at % and 20 at % or less, and a ratio of a sum of the amounts of the Pt and the at least one metal element to the total amount is 60 at % or less; mixing the weighed Pt powder, the weighed Fe powder, the weighed metal powder containing the at least one metal element, and a C powder composed of primary particles containing unavoidable impurities and not forming secondary particles such that a primary particle diameter of the C powder is not essentially reduced to thereby produce a powder mixture for pressure sintering; and then molding the produced powder mixture for pressure sintering while the powder mixture is heated under application of pressure.

In the first to fifth aspects of the method for manufacturing an FePt—C-based sputtering target according to the present invention, a volume fraction of the C powder relative to a total volume of the powder mixture for pressure sintering is preferably 5 vol % or more and 60 vol % or less.

A sixth aspect of a method for manufacturing an FePt—C-based sputtering target according to the present invention is a method for manufacturing an FePt—C-based sputtering target, the method including: adding an oxide powder containing unavoidable impurities to an FePt-based alloy powder containing 33 at % or more and 60 at % or less of Pt with the balance being Fe and unavoidable impurities; mixing the oxide powder and the FePt-based alloy powder such that mechanical alloying occurs to thereby produce a first powder mixture; adding a C powder composed of primary particles containing unavoidable impurities and not forming secondary particles to the produced first powder mixture; mixing the C powder and the first powder mixture such that a primary particle diameter of the C powder is not essentially reduced to thereby produce a powder mixture for pressure sintering; and then molding the produced powder mixture for pressure sintering while the powder mixture is heated under application of pressure.

A seventh aspect of a method for manufacturing an FePt—C-based sputtering target according to the present invention is a method for manufacturing an FePt—C-based sputtering target, the method including: weighing a Pt powder containing unavoidable impurities and an Fe powder containing unavoidable impurities such that a ratio of an amount of the Pt to a total amount of the Fe and the Pt is 33 at % or more and 60 at % or less; mixing the weighed Pt powder, the weighed Fe powder, and an oxide powder containing unavoidable impurities such that mechanical alloying occurs to thereby produce a first powder mixture; adding a C powder composed of primary particles containing unavoidable impurities and not forming secondary particles to the produced first powder mixture; mixing the C powder and the first powder mixture such that a primary particle diameter of the C powder is not essentially reduced to thereby produce a powder mixture for pressure sintering; and then molding the produced powder mixture for pressure sintering while the powder mixture is heated under application of pressure.

An eighth aspect of a method for manufacturing an FePt—C-based sputtering target according to the present invention is a method for manufacturing an FePt—C-based sputtering target, the method including: adding an oxide powder containing unavoidable impurities to an FePt-based alloy powder containing 33 at % or more and less than 60 at % of Pt and more than 0 at % and 20 at % or less of at least one metal element other than Fe and Pt with the balance being Fe and unavoidable impurities and with a total amount of Pt and the at least one metal element being 60 at % or less; mixing the oxide powder and the FePt-based alloy powder such that mechanical alloying occurs to thereby produce a first powder mixture; adding a C powder composed of primary particles containing unavoidable impurities and not forming secondary particles to the produced first powder mixture; mixing the C powder and the first powder mixture such that a primary particle diameter of the C powder is not essentially reduced to thereby produce a powder mixture for pressure sintering; and then molding the produced powder mixture for pressure sintering while the powder mixture is heated under application of pressure.

A ninth aspect of a method for manufacturing an FePt—C-based sputtering target according to the present invention is a method for manufacturing an FePt—C-based sputtering target, the method including: weighing an FePt-based alloy powder composed of Pt, Fe, and unavoidable impurities and a metal powder containing at least one metal element other than Fe and Pt with the balance being unavoidable impurities such that a ratio of an amount of the Pt to a total amount of the Pt, the Fe, and the at least one metal element is 33 at % or more and less than 60 at %, a ratio of an amount of the at least one metal element to the total amount is more than 0 at % and 20 at % or less, and a ratio of a sum of the amounts of the Pt and the at least one metal element to the total amount is 60 at % or less; mixing the weighed FePt-based alloy powder, the weighed metal powder containing the at least one metal element, and an oxide powder containing unavoidable impurities such that mechanical alloying occurs to thereby produce a first powder mixture; adding a C powder composed of primary particles containing unavoidable impurities and not forming secondary particles to the produced first powder mixture; mixing the C powder and the first powder mixture such that a primary particle diameter of the C powder is not essentially reduced to thereby produce a powder mixture for pressure sintering; and then molding the produced powder mixture for pressure sintering while the powder mixture is heated under application of pressure.

A tenth aspect of a method for manufacturing an FePt—C-based sputtering target according to the present invention is a method for manufacturing an FePt—C-based sputtering target, the method including: weighing a Pt powder containing unavoidable impurities, an Fe powder containing unavoidable impurities, and a metal powder containing at least one metal element other than Fe and Pt with the balance being unavoidable impurities such that a ratio of an amount of the Pt to a total amount of the Pt, the Fe, and the at least one metal element is 33 at % or more and less than 60 at %, a ratio of an amount of the at least one metal element to the total amount is more than 0 at % and 20 at % or less, and a ratio of a sum of the amounts of the Pt and the at least one metal element to the total amount is 60 at % or less; mixing the weighed Pt powder, the weighed Fe powder, the weighed metal powder containing the at least one metal element, and an oxide powder containing unavoidable impurities such that mechanical alloying occurs to thereby produce a first powder mixture; adding a C powder composed of primary particles containing unavoidable impurities and not forming secondary particles to the produced first powder mixture; mixing the C powder and the first powder mixture such that a primary particle diameter of the C powder is not essentially reduced to thereby produce a powder mixture for pressure sintering; and then molding the produced powder mixture for pressure sintering while the powder mixture is heated under application of pressure.

In the sixth to tenth aspects of the method for manufacturing an FePt—C-based sputtering target according to the present invention, a volume fraction of the C powder relative to a total volume of the powder mixture for pressure sintering is 5 vol % or more and less than 60 vol %, a volume fraction of the oxide powder relative to the total volume of the powder mixture for pressure sintering is 3 vol % or more and less than 55 vol %, and a sum of the volume fractions of the C powder and the oxide powder relative to the total volume of the powder mixture for pressure sintering is 8 vol % or more and 60 vol % or less.

In the third, fourth, fifth, eighth, ninth, tenth aspect of an FePt—C-based sputtering target according to the present invention, the one or more kinds of metal elements other than Fe and Pt may be one or more kinds of Cu, Ag, Mn, Ni, Co, Pd, Cr, V, and B.

In the sixth to tenth aspects of the method for manufacturing an FePt—C-based sputtering target according to the present invention, the oxide powder may contain at least one of $SiO_2$, $TiO_2$, $Ti_2O_3$, $Ta_2O_5$, $Cr_2O_3$, $CoO$, $CO_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

In the first to tenth aspects of the method for manufacturing an FePt—C-based sputtering target according to the present invention, the primary particles in the C powder preferably have an average diameter of 1 μm or more and 30 μm or less. The crystal structure of the C powder is preferably an amorphous structure or a diamond structure.

In the FePt—C-based sputtering target according to the present invention, the primary particles of C (carbon) are dispersed in the FePt-based alloy phase such that the particles are not in contact with each other, so that the primary particles of C (carbon) are easily covered with the FePt-based alloy. This can prevent the C (carbon) from falling off the target as clusters during sputtering to thereby form particles. Therefore, preferable sputtering with a reduced number of particles generated can be achieved.

In the manufacturing method according to the present invention, since a sintering process is used instead of a casting process, the content of C relative to the total amount of the target can be increased, so that an FePt—C-based sputtering target in which the volume fraction of C relative to the total volume of the target is 5 vol % or more and 60 vol % or less can be produced. Therefore, by performing sputtering using the FePt—C-based sputtering target produced by the manufacturing method according to the present invention, a thin film containing an FePt-based alloy and capable of being used as a magnetic recording medium can be formed using only the above target alone, i.e., without using a plurality of targets.

DESCRIPTION OF EMBODIMENTS

Figure 1:
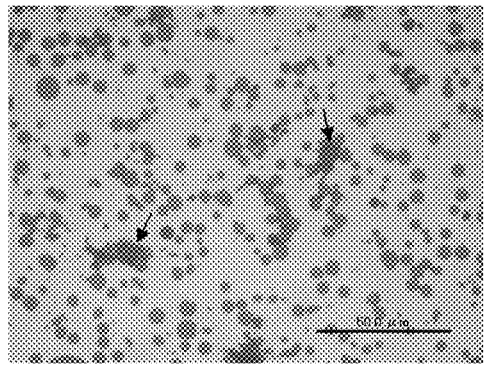
FIG. 1 is a metallurgical microscope photograph of the structure of the sintered body in Example 1 (the magnification of the photograph when it was taken: 1000×, the scale in the photograph: 50 μm).

Embodiments of the present invention will next be described in detail.

1. First Embodiment 1-1. Components and Structure of Sputtering Target

An FePt—C-based sputtering target according to a first embodiment of the present invention contains Fe, Pt, and C. The FePt—C-based sputtering target is characterized in that it has a structure in which primary particles of C that contain unavoidable impurities are dispersed in an FePt-based alloy phase containing 33 at % or more and 60 at % or less of Pt with the balance being Fe and unavoidable impurities, the primary particles of C being dispersed so as not to be in contact with each other. In the present description, the phrase "α or more and β or less" may be described as "α to β."

1-1-1. FePt-Based Alloy

The FePt-based alloy can have an fct structure with high magnetocrystalline anisotropy when subjected to heat treatment at high temperature (e.g., 600° C. or higher). Therefore, the FePt-based alloy has a role in serving as a recording layer of a magnetic recording medium and is a main component of the FePt—C-based sputtering target according to the embodiment of the present invention.

The reason that the content of Pt in the FePt-based alloy phase is specified as 33 to 60 at % is that, if the content of Pt in the FePt-based alloy phase is not 33 to 60 at %, an fct (face centered tetragonal) structure may not appear. From the viewpoint of allowing the fct (face centered tetragonal) structure to appear reliably in the FePt-based alloy phase, the content of Pt in the FePt-based alloy phase is preferably 45 to 55 at %, more preferably 49 to 51 at %, and particularly preferably 50 at %.

1-1-2. C (Carbon)

C (carbon) can form the partitions for separating the FePt-based alloy grains, which are magnetic grains, from each other in a FePtC-based layer obtained by sputtering, and has a role in reducing and uniformizing the size of the FePt-based alloy grains in the FePtC-based layer. C (carbon) is one of main components in the FePt—C-based sputtering target according to the first embodiment.

The volume fraction of C (carbon) relative to the total volume of the target is preferably 5 to 60 vol %. When the volume fraction of C (carbon) relative to the total volume of the target is 5 to 60 vol %, the C (carbon) serves as partition walls that separate the grains of the FePt-based alloy, which are magnetic grains, from each other in the FePtC-based layer obtained by sputtering, so that the certainty of achievement of the effect of reducing the grains of the FePt-based alloy in size uniformly can be increased. If the volume fraction of C (carbon) is less than 5 vol %, this effect may not be achieved sufficiently. If the volume fraction of C (carbon) exceeds 60 vol %, the number of grains of the FePt-based alloy per unit volume in the FePtC-based layer obtained by sputtering becomes small, and this is disadvantageous in terms of storage capacity. From the viewpoint of increasing the certainty of achievement of the effect of reducing the grains of the FePt-based alloy in size uniformly in the FePtC-based layer and from the viewpoint of the storage capacity of the FePtC-based layer to be formed, the volume fraction of C (carbon) relative to the total volume of the target is preferably 10 to 50 vol %, more preferably 20 to 40 vol %, and particularly preferably 25 to 35 vol %.

1-1-3. Structure of Target

The FePt—C-based sputtering target according to the first embodiment of the present invention has a structure in which the primary particles of C (carbon) that contain unavoidable impurities are dispersed in the FePt-based alloy phase containing 33 to 60 at % of Pt with the balance being Fe and unavoidable impurities. The primary particles of C (carbon) are dispersed so as not to be in contact with each other and do not form secondary particles.

The reason that the FePt—C-based sputtering target according to the first embodiment has the structure in which the primary particles of C (carbon) not forming secondary particles are dispersed in the FePt-based alloy phase so as not to be in contact with each other is as follows. When the primary particles of C (carbon) are reliably covered with the FePt-based alloy, the C (carbon) is prevented from falling off the target as clusters during sputtering, so that the formation of particles is prevented. Therefore, sputtering can be performed favorably. If the C (carbon) in the target forms secondary particles, primary particles of C present inside the secondary particles are unlikely to be covered with the FePt-based alloy phase, so that the primary particles of C present inside the secondary particles may fall off the target during sputtering to thereby form particles.

If the average particle diameter of the primary particles of C (carbon) is small, the area of surface portions of the primary particles of C (carbon) that are not covered with the FePt-based alloy becomes large in the target obtained, unless the average particle diameter of an FePt-based alloy powder (or an Fe powder and a Pt powder) in a powder mixture for pressure sintering is as small as or smaller than the average diameter of the primary particles of C (carbon). In this case, the C (carbon) in the primary particles may fall off the target as clusters during sputtering, and the number of particles generated during sputtering may become large. Therefore, it is preferable that the average diameter of the primary particles of C (carbon) be equal to or larger than a prescribed size. However, primary particles of C (carbon) having an excessively large average diameter are not preferred because the sputtering rate during sputtering may differ significantly at different positions.

From the viewpoint of covering the surfaces of the primary particles of C (carbon) with the FePt-based alloy and from the viewpoint of the sputtering rate, the average diameter of the primary particles of C (carbon) is preferably 1 to 30 μm, more preferably 3 to 115 μm, and particularly preferably 5 to 10 μm.

In the present description, the average particle diameter is a particle diameter at which a cumulative frequency curve of a particle diameter distribution measured by a laser diffraction method reaches 50%, i.e., is a median diameter.

From the viewpoint of reducing the number of particles generated during sputtering, the total surface area of surface portions of the C (carbon) that are covered with the FePt-based alloy in the target is preferably 80% or more of the total surface area of the C (carbon) in the target, more preferably 90% or more, and particularly preferably 95% or more.

No particular limitation is imposed on the shape of the primary particles of C (carbon). For example, the primary particles of C (carbon) may have an approximately spherical shape in which a value obtained by dividing its major axis by its minor axis is 2 or less. Primary particles having such a shape provide the following effect. The surface area of the C can be reduced, and the ratio of the area of the surface portions of the C that are covered with the FePt-based alloy (relative to the total surface area of the C) can be easily increased. In addition, among primary particles of C (carbon) with a large average diameter, primary particles having such a shape are easily available.

Preferably, the crystal structure of the primary particles of C (carbon) is an amorphous structure or a diamond structure. This is because, in the amorphous structure or the diamond structure, the bonding strength between the carbon atoms in the crystal is high, so that the risk of breakdown of the primary particles of C (carbon) during sputtering is small. If breakdown of the primary particles of C (carbon) occurs during sputtering, particles may be generated.

As for the relative density of the target, the larger the value of the relative density, the smaller the amount of voids in the target. Therefore, the larger value of the relative density is preferable in terms of performing sputtering favorably. Specifically, the relative density of the target is preferably 90% or larger and more preferably 95% or larger.

1-1-4. Metal Element Other than Fe and Pt

The FePt—C-based sputtering target according to the first embodiment contains only Fe and Pt as metal elements. However, the FePt-based alloy phase may contain a metal element other than Fe and Pt (modification of the first embodiment).

In this case, from the viewpoint of allowing the fct (face centered tetragonal) structure to appear reliably in the FePt-based alloy phase, the FePt-based alloy phase may contain 33 at % or more and less than 60 at % of Pt, more than 0 at % and 20 at % or less of the at least one metal element other than Fe and Pt with the balance being Fe and unavoidable impurities and with the total amount of Pt and the at least one metal element being 60 at % or less.

In the modification of the first embodiment, from the viewpoint of allowing the fct (face centered tetragonal) structure to appear more reliably in the FePt-based alloy phase, the content of Pt in the FePt-based alloy phase is preferably 45 to 55 at % and more preferably 49 to 51 at %. However, it is premised that the total content of Fe and Pt is less than 100 at %, the total content of the at least one metal element other than Fe and Pt is more than 0 at % and 20 at % or less, and the sum of the content of Pt and the total content of the at least one metal element other than Fe and Pt is 60 at % or less.

Examples of the metal element other than Fe and Pt that can be contained in the FePt-based alloy phase are Cu, Ag, Mn, Ni, Co, Pd, Cr, V, and B. One or more of these metal elements may be contained.

When Cu is contained, the temperature of the heat treatment for converting the crystal structure of the FePt-based alloy to the fct structure can be reduced (to, for example, 600° C.), so that the cost of the heat treatment on an FePtC-based layer obtained by sputtering can be reduced. In addition, the addition of Cu may allow the crystal structure of the obtained FePtC-based layer to be converted to the fct structure by heat generated during sputtering without additional heat treatment.

1-2. Manufacturing Method

The FePt—C-based sputtering target according to the first embodiment can be manufactured by: adding a C powder composed of primary particles containing unavoidable impurities and not forming secondary particles to an FePt-based alloy powder having an average particle diameter of 20 µm or less and containing 33 at % or more and 60 at % or less of Pt with the balance being Fe and unavoidable impurities; mixing the C powder and the FePt-based alloy powder such that the primary particle diameter of the C powder is not essentially reduced (the number of particles generated when sputtering is performed using the target obtained is not increased) to thereby produce a powder mixture for pressure sintering; and then molding the produced powder mixture for pressure sintering while the powder mixture is heated under application of pressure.

If the average particle diameter of the FePt-based alloy powder exceeds 20 µm, the primary particles of the C powder may not be sufficiently surrounded by the FePt-based alloy powder, so that the number of particles generated when sputtering is performed using the sputtering target obtained may increase.

No particular limitation is imposed on the atmosphere when the FePt-based alloy powder and the C powder are mixed to produce the powder mixture for pressure sintering, and the FePt-based alloy powder and the C powder may be mixed in air.

Instead of the FePt-based alloy powder, a single Fe powder with an average particle diameter of 20 µm or less and a single Pt powder with an average particle diameter of 20 µm or less may be used. In this case, the single Fe powder and the single Pt powder are weighed such that the ratio of the amount of Pt to the total amount of Fe and Pt is 33 at % or more and 60 at % or less. Then the weighed single Fe powder, the weighed single Pt powder, and the C powder composed of primary particles containing unavoidable impurities and not forming secondary particles are mixed such that the primary particle diameter of the C powder is not essentially reduced to thereby produce a powder mixture for pressure sintering. Then the produced powder mixture for pressure sintering is molded while the powder mixture is heated under application of pressure.

However, since the activity of the single Fe powder is high, it may ignite in air and therefore must be handled with sufficient care. By alloying Fe and Pt to form an FePt-based alloy powder, the activity of the Fe can be lowered even though it is in powder form. The use of the FePt-based alloy powder is more preferred from this point of view.

No particular limitation is imposed on the method for molding the powder mixture for pressure sintering produced as described above while the powder mixture is heated under application of pressure. For example, a hot pressing method, a hot isostatic pressing method (HIP method), a spark plasma sintering method (SPS method), etc. may be used. Preferably, when implementing the present invention, such a molding method is performed in a vacuum or an inert gas atmosphere. In this case, even when the powder mixture contains a certain amount of oxygen, the amount of oxygen in the obtained sintered product decreases.

When the FePt-based alloy phase contains a metal element other than Fe and Pt as in the modification of the first embodiment, an FePt-based alloy powder having an average particle diameter of 20 µm or less and containing 33 at % or more and less than 60 at % of Pt, more than 0 at % and 20 at % or less of at least one metal element other than Fe and Pt with the balance being Fe and unavoidable impurities and with the total amount of Pt and the at least one metal element being 60 at % or less may be used instead of the FePt-based alloy powder used in the first embodiment, having an average particle diameter of 20 µm or less, and containing 33 at % or more and 60 at % or less of Pt with the balance being Fe and unavoidable impurities. The subsequent steps are the same as those when the FePt-based alloy phase does not contain a metal element other than Fe and Pt (as in the first embodiment).

Alternatively, an FePt-based alloy powder composed of Pt, Fe, and unavoidable impurities and having an average particle diameter of 20 µm or less and a metal powder containing at least one metal element other than Fe and Pt and unavoidable impurities and having an average particle diameter of 20 µm or less may be used.

In this case, the FePt-based alloy powder composed of Pt, Fe, and unavoidable impurities and having an average particle diameter of 20 µm or less and the metal powder containing at least one metal element other than Fe and Pt with the balance being unavoidable impurities and having an average particle diameter of 20 µm or less are weighed such that the ratio of the amount of the Pt with respect to the total amount of the Pt, the Fe, and the at least one metal element is 33 at % or more and less than 60 at %, the ratio of the amount of the at least one metal element with respect to the total amount is more than 0 at % and 20 at % or less, and the ratio of the sum of the amounts of the Pt and the at least one metal element with respect to the total amount is 60 at % or less. Then the weighed FePt-based alloy powder, the weighed metal powder composed of the at least one metal element, and a C powder composed of primary particles containing unavoidable impurities and not forming secondary particles are mixed such that the primary particle diameter of the C powder is not essentially reduced to thereby produce a powder mixture for pressure sintering. Then the produced powder mixture for pressure sintering is molded while the powder mixture is heated under application of pressure.

Alternatively, a single Pt powder containing unavoidable impurities and having an average particle diameter of 20 µm or less, a single Fe powder containing unavoidable impurities and having an average particle diameter of 20 µm or less, and a metal powder containing at least one metal element other than Fe and Pt with the balance being unavoidable impurities and having an average particle diameter of 20 µm or less may be used.

In this case, the single Pt powder having an average particle diameter of 20 µm or less, the single Fe powder having an average particle diameter of 20 µm or less, and the metal powder containing the at least one metal element other than Fe and Pt and having an average particle diameter of 20 µm or less are weighed such that the ratio of the amount of the Pt with respect to the total amounts of the Pt, the Fe, and the at least one metal element is 33 at % or more and less than 60 at %, the ratio of the amount of the at least one metal element with respect to the total amount is more than 0 at % and 20 at % or less, and the ratio of the sum of the amounts of the Pt and the at least one metal element with respect to the total amount is 60 at % or less. Then the weighed single Pt powder, the weighed single Fe powder, the weighed metal powder containing the at least one metal element, and a C powder composed of primary particles containing unavoidable impurities and not forming secondary particles are mixed such that the primary particle diameter of the C powder is not essentially reduced to thereby produce a powder mixture for pressure sintering. Then the produced powder mixture for pressure sintering is molded while the powder mixture is heated under application of pressure.

1-3. Effects

In the FePt—C-based sputtering target according to the first embodiment, the primary particles of C (carbon) not forming secondary particles are dispersed in the FePt-based alloy phase such that the primary particles of C (carbon) are easily covered with the FePt-based alloy. This can prevent the C (carbon) from falling off the target as clusters during sputtering to thereby form particles. Therefore, preferable sputtering with a reduced number of particles generated can be achieved.

In the manufacturing method according to the first embodiment, since a sintering process is used instead of a casting process, the content of C relative to the total amount of the target can be increased, so that an FePt—C-based sputtering target in which the volume fraction of C relative to the total volume of the target is 5 vol % or more and 60 vol % or less can be produced. Therefore, by performing sputtering using the FePt—C-based sputtering target produced by the manufacturing method according to the first embodiment, a thin film containing an FePt-based alloy and capable of being used as a magnetic recording medium can be formed using only the above target alone, i.e., without using a plurality of targets.

2. Second Embodiment 2-1. Components and Structure of Sputtering Target

The FePt—C-based sputtering target according to the first embodiment contains Fe and Pt as alloy components and further contains C (carbon) in addition to the alloy components (Fe and Pt). However, an FePt—C-based sputtering target according to a second embodiment of the present invention contains Fe and Pt as alloy components and further contains C (carbon) and an oxide in addition to the alloy components (Fe and Pt). This is the difference from the FePt—C-based sputtering target according to the first embodiment. Specifically, the FePt—C-based sputtering target according to the second embodiment of the present invention has a structure in which primary particles of C that contain unavoidable impurities and a metal oxide containing unavoidable impurities are dispersed in an FePt-based alloy phase containing 33 at % or more and 60 at % or less of Pt with the balance being Fe and unavoidable impurities, the primary particles of C being dispersed so as not to be in contact with each other.

An FePt—C-based sputtering target according to a second embodiment will be described below, but the description of the same content as in the FePt—C-based sputtering target according to the first embodiment will be appropriately omitted.

2-1-1. FePt-Based Alloy

The description of the FePt-based alloy in the second embodiment to be mentioned here is overlapped with the content described in "1-1-1. FePt-based Alloy" in the first embodiment, and accordingly the description thereof will be omitted.

2-1-2. C and Metal Oxide

C and the metal oxide can form the partitions for separating the FePt-based alloy grains, which are magnetic grains, from each other in a layer containing the FePt-based alloy, C, and the metal oxide (hereinafter, may be referred to as an FePt—C-metal oxide layer) obtained by sputtering, and have a role in reducing and uniformizing the size of the FePt-based alloy grains in the FePt—C-metal oxide layer. C and the metal oxide are main components in the FePt—C-based sputtering target according to the second embodiment.

As described later, first, a powder of the FePt-based alloy (or an Fe powder and a Pt powder) and a powder of the metal oxide can be mixed sufficiently since the metal oxide is contained. Therefore, a first powder mixture including the FePt-based alloy powder (or the Fe powder and the Pt powder) reduced in average particle diameter can be produced. The average particle diameter of the FePt-based alloy powder (or the Fe powder and the Pt powder) in the first powder mixture can be sufficiently reduced by mixing the powders sufficiently. Then the thus-produced first powder mixture and a C powder composed of primary particles of C are mixed such that the primary particle diameter of the C powder is not essentially reduced to thereby form a powder mixture for pressure sintering. In this case, the primary particles of C not essentially reduced in diameter are easily surrounded by the FePt-based alloy powder (or the Fe powder and the Pt powder) densely. By subjecting the obtained powder mixture for pressure sintering to pressure sintering, a target in which the primary particles of C are sufficiently covered with the FePt-based alloy phase can be produced.

In the second embodiment, the volume fraction of C relative to the total volume of the target is 5 vol % or more and less than 60 vol %, the volume fraction of the metal oxide relative to the total volume of the target is 3 vol % or more and less than 55 vol %, and the sum of the volume fraction of C and the volume fraction of the metal oxide relative to the total volume of the target is 8 vol % or more and 60 vol % or less.

The reason that the volume fraction of C relative to the total volume of the target is set to be 5 vol % or more and less than 60 vol % is as follows. The C serves as partition walls that separate the grains of the FePt-based alloy, which are magnetic grains, from each other in the FePt—C-metal oxide layer obtained by sputtering, so that the effect of reducing and uniformizing the size of the grains of the FePt-based alloy is achieved. The reason that the volume fraction of the metal oxide relative to the total volume of the target is set to be 3 vol % or more and less than 55 vol % is that the FePt-based alloy powder and the metal oxide powder are first mixed sufficiently so that a first powder mixture including the FePt-based alloy powder reduced in average particle diameter can be produced.

If the volume fraction of C relative to the total volume of the target is less than 5 vol % or if the volume fraction of the metal oxide relative to the total volume of the target is less than 3 vol %, the above-described effect may not be achieved sufficiently. If the total amount of C and the metal oxide exceeds 60 vol %, the number of grains of the FePt-based alloy per unit volume of the FePt—C-metal oxide layer obtained by sputtering becomes small, and this is disadvantageous in terms of storage capacity.

From the viewpoint of achieving the effect of reducing and uniformizing the size of the grains of the FePt-based alloy in the FePt—C-metal oxide layer, from the viewpoint of producing a first powder mixture including the FePt-based alloy powder reduced in average particle diameter, and from the viewpoint of the storage capacity of the FePt-metal oxide layer to be formed, it is preferable that the amount of C relative to the total volume of the target be 10 vol % or more and 50 vol % or less, the amount of the metal oxide relative to the total volume of the target be 5 vol % or more and 45 vol % or less, and the total amount of C and the metal oxide relative to the total volume of the target be 15 vol % or more and 55 vol % or less.

In the second embodiment, the metal oxide may contain, for example, at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

It was experimentally checked in Reference Example 2 described later that the metal oxide ($SiO_2$) was much less likely to form particles than C.

2-1-3. Structure of Target

The FePt—C-based sputtering target according to the second embodiment of the present invention has a structure in which the primary particles of C (carbon) that contain unavoidable impurities and the metal oxide containing unavoidable impurities are dispersed in the FePt-based alloy phase containing 33 to 60 at % of Pt with the balance being Fe and unavoidable impurities. In this structure, the primary particles of C (carbon) are not in contact with each other and do not form secondary particles.

The reason that the FePt—C-based sputtering target according to the second embodiment has the structure in which the primary particles of C (carbon) not forming secondary particles are dispersed in the FePt-based alloy phase so as not to be in contact with each other is as follows. When the primary particles of C (carbon) are reliably covered with the FePt-based alloy, the C (carbon) is prevented from falling off the target as clusters during sputtering, so that the formation of particles is prevented. Therefore, sputtering can be performed favorably. If the C (carbon) in the target forms secondary particles, primary particles of C present inside the secondary particles are unlikely to be covered with the FePt-based alloy phase, so that the primary particles of C present inside the secondary particles may fall off the target during sputtering to thereby form particles.

If the average particle diameter of the primary particles of C (carbon) is small, the area of surface portions of the primary particles of C (carbon) that are not covered with the FePt-based alloy becomes large in the target obtained, unless the average particle diameter of an FePt-based alloy powder in a powder mixture for pressure sintering is as small as or smaller than the average diameter of the primary particles of C (carbon). In this case, the C (carbon) in the primary particles may fall off the target as clusters during sputtering, and the number of particles generated during sputtering may become large. Therefore, it is preferable that the average diameter of the primary particles of C (carbon) be equal to or larger than a prescribed size. However, primary particles of C (carbon) having an excessively large average diameter are not preferred because the sputtering rate during sputtering may differ significantly at different positions.

From the viewpoint of covering the surfaces of the primary particles of C (carbon) with the FePt-based alloy and from the viewpoint of the sputtering rate, the average diameter of the primary particles of C (carbon) is preferably 1 to 30 μm, more preferably 3 to 115 μm, and particularly preferably 5 to 10 μm.

From the viewpoint of reducing the number of particles generated during sputtering, the total surface area of surface portions of the C (carbon) that are covered with the FePt-based alloy in the target is preferably 80% or more of the total surface area of the C (carbon) in the target, more preferably 90% or more, and particularly preferably 95% or more.

No particular limitation is imposed on the shape of the primary particles of C (carbon). For example, the primary particles of C (carbon) may have an approximately spherical shape in which a value obtained by dividing its major axis by its minor axis is 2 or less.

Preferably, the crystal structure of the primary particles of C (carbon) is an amorphous structure or a diamond structure.

As for the relative density of the target, the larger the value of the relative density, the smaller the amount of voids in the target. Therefore, the larger value of the relative density is preferable in terms of performing sputtering favorably. Specifically, the relative density of the target is preferably 90% or larger and more preferably 95% or larger.

2-1-4. Metal Element Other than Fe and Pt

The FePt—C-based sputtering target according to the second embodiment contains only Fe and Pt as metal elements. However, as in the FePt—C-based sputtering target according to the first embodiment, the FePt-based alloy phase may contain a metal element other than Fe and Pt (modification of the second embodiment).

The details of the metal element other than Fe and Pt that may be contained in the FePt-based alloy phase in the second embodiment are the same as the details described in "1-1-4. Metal element other than Fe and Pt" in the first embodiment, and the description thereof will be omitted.

2-2. Manufacturing Method

When the FePt—C-based sputtering target according to the second embodiment is manufactured, the FePt-based alloy powder containing 33 to 60 at % of Pt with the balance being Fe and unavoidable impurities and the metal oxide powder are first mixed sufficiently (mixed to the extent that mechanical alloying occurs) to thereby produce a first powder mixture including the FePt-based alloy powder sufficiently reduced in average particle diameter. When the FePt-based alloy powder is produced by an atomizing method, the average particle diameter is 30 μm or more for most cases. However, even with the FePt-based alloy powder having a large average particle diameter described above, the average particle diameter of the FePt-based alloy powder can be sufficiently reduced by mixed sufficiently with the metal oxide powder (mixed to the extent that mechanical alloying occurs).

The FePt-based alloy powder in the first powder mixture is sufficiently reduced in average particle diameter. Therefore, when the first powder mixture and the C powder composed of primary particles of C are mixed to form a powder mixture for pressure sintering, the primary particles of C are easily surrounded by the FePt-based alloy powder densely. By subjecting the obtained powder mixture for pressure sintering to pressure sintering, a target in which the primary particles of C are sufficiently covered with the FePt-based alloy phase can be produced.

Specifically, the FePt—C-based sputtering target according to the second embodiment can be manufactured by:

adding the C powder composed of primary particles of C not forming secondary particles to the first powder mixture; mixing them such that the diameter of the C particles, which are primary particles, is not essentially reduced (within a range where the number of particles generated when sputtering is performed using the obtained target does not increase) to thereby produce a powder mixture for pressure sintering; and then molding the produced powder mixture for pressure sintering while the powder mixture is heated under application of pressure.

No particular limitation is imposed on the atmosphere when the FePt-based alloy powder and the metal oxide powder are mixed to produce the first powder mixture, and they may be mixed in air. No particular limitation is imposed on the atmosphere when the first powder mixture and the C powder are mixed to produce the powder mixture for pressure sintering, and they may be mixed in air. Mixing in air allows a reduction in cost.

Instead of the FePt-based alloy powder, a single Fe powder and a single Pt powder may be used. In this case, the single Fe powder, the single Pt powder, and the metal oxide powder are sufficiently mixed to reduce the average particle diameters of the single Fe powder and the single Pt powder, whereby a first powder mixture is produced. The subsequent steps are the same as those when the FePt-based alloy powder is used.

However, since the activity of the single Fe powder is high, it may ignite in air and therefore must be handled with sufficient care. By alloying Fe and Pt to form an FePt-based alloy powder, the activity of the Fe can be lowered even though it is in powder form. The use of the FePt-based alloy powder is more preferred from this point of view.

No particular limitation is imposed on the method for molding the powder mixture for pressure sintering produced as described above while the powder mixture is heated under application of pressure. For example, a hot pressing method, a hot isostatic pressing method (HIP method), a spark plasma sintering method (SPS method), etc. may be used. Preferably, when implementing the present invention, such a molding method is performed in a vacuum or an inert gas atmosphere. In this case, even when the powder mixture contains a certain amount of oxygen, the amount of oxygen in the obtained sintered product decreases.

When the FePt-based alloy phase contains a metal element other than Fe and Pt as in the modification of the second embodiment, an FePt-based alloy powder containing 33 at % or more and less than 60 at % of Pt, more than 0 at % and 20 at % or less of at least one metal element other than Fe and Pt with the balance being Fe and unavoidable impurities and with the total amount of Pt and the at least one metal element being 60 at % or less may be used instead of the FePt-based alloy powder used in the second embodiment containing 33 at % or more and 60 at % or less of Pt with the balance being Fe and unavoidable impurities. The subsequent steps are the same as those when the FePt-based alloy phase does not contain a metal element other than Fe and Pt (as in the second embodiment).

Alternatively, an FePt-based alloy powder composed of Pt, Fe, and unavoidable impurities and a metal powder containing at least one metal element other than Fe and Pt and unavoidable impurities may be used.

In this case, the FePt-based alloy powder composed of Pt, Fe, and unavoidable impurities and the metal powder containing at least one metal element other than Fe and Pt with the balance being unavoidable impurities are weighed such that the ratio of the amount of the Pt with respect to the total amount of the Pt, the Fe, and the at least one metal element is 33 at % or more and less than 60 at %, the ratio of the amount of the at least one metal element with respect to the total amount is more than 0 at % and 20 at % or less, and the ratio of the sum of the amounts of the Pt and the at least one metal element with respect to the total amount is 60 at % or less. Then the weighed FePt-based alloy powder, the weighed metal powder composed of the at least one metal element, and an oxide powder containing unavoidable impurities are mixed to the extent that mechanical alloying occurs to thereby produce a first powder mixture. Then a C powder composed of primary particles containing unavoidable impurities and not forming secondary particles is added to the produced first powder mixture, and they are mixed such that the primary particle diameter of the C powder is not essentially reduced to thereby produce a powder mixture for pressure sintering. Then the produced powder mixture for pressure sintering is molded while the powder mixture is heated under application of pressure.

Alternatively, a single Pt powder containing unavoidable impurities, a single Fe powder containing unavoidable impurities, and a metal powder containing at least one metal element other than Fe and Pt with the balance being unavoidable impurities may be used.

In this case, the single Pt powder, the single Fe powder, and the metal powder containing the at least one metal element other than Fe and Pt are weighed such that the ratio of the amount of the Pt with respect to the total amounts of the Pt, the Fe, and the at least one metal element is 33 at % or more and less than 60 at o, the ratio of the amount of the at least one metal element with respect to the total amount is more than 0 at % and 20 at % or less, and the ratio of the sum of the amounts of the Pt and the at least one metal element with respect to the total amount is 60 at % or less. Then the weighed single Pt powder, the weighed single Fe powder, the weighed metal powder composed of the at least one metal element, and an oxide powder containing unavoidable impurities are mixed to the extent that mechanical alloying occurs to thereby produce a first powder mixture. A C powder composed of primary particles containing unavoidable impurities and not forming secondary particles is added to the produced first powder mixture, and they are mixed such that the primary particle diameter of the C powder is not essentially reduced to thereby produce a powder mixture for pressure sintering. Then the produced powder mixture for pressure sintering is molded while the powder mixture is heated under application of pressure.

2-3. Effects

In the FePt—C-based sputtering target according to the second embodiment, the primary particles of C (carbon) not forming secondary particles are dispersed in the FePt-based alloy phase so as not to be in contact with each other. Therefore, the primary particles of C (carbon) are easily covered with the FePt-based alloy. This can prevent the C (carbon) from falling off the target as clusters during sputtering to thereby form particles. Therefore, preferable sputtering with a reduced number of particles generated can be achieved.

The FePt—C-based sputtering target according to the second embodiment contains the metal oxide. Therefore, when the powder mixture for pressure sintering is produced, the FePt-based alloy powder (or the Fe metal powder and the Pt metal powder) and the metal oxide powder are first mixed sufficiently, whereby a first powder mixture including the FePt-based alloy powder (or the Fe metal powder and the Pt metal powder) reduced in average particle diameter can be produced. The average particle diameter of the FePt-based alloy powder (or the Fe metal powder and the Pt metal powder) in the first powder mixture can be sufficiently reduced by mixing it with the metal oxide powder sufficiently. Then the thus-produced first powder mixture and the C powder composed of primary particles of C are mixed to form a powder mixture for pressure sintering. In this case, the primary particles of C are easily surrounded by the FePt-based alloy powder (or the Fe metal powder and the Pt metal powder) densely. By subjecting the obtained powder mixture for pressure sintering to pressure sintering, a target in which the primary particles of C are sufficiently covered with the FePt-based alloy phase can be produced.

Therefore, even when the initial average particle diameter of the FePt-based alloy powder (or the Fe metal powder and the Pt metal powder) is large, i.e., about 30 μm, a target in which the primary particles of C are sufficiently covered with the FePt-based alloy phase can be produced by mixing the FePt-based alloy powder (or the Fe metal powder and the Pt metal powder) and the metal oxide powder sufficiently in the step of producing the first powder mixture.

In the manufacturing method according to the second embodiment, since a sintering process is used instead of a casting process, the content of C and metal oxide relative to the total amount of the target can be increased, so that an FePt—C-based sputtering target in which the volume fraction of C relative to the total volume of the target is 5 vol % or more and less than 60 vol %, a volume fraction of the oxide phase relative to the total volume of the target is 3 vol % or more and less than 55 vol %, and a sum of the volume fractions of the C and the oxide phase relative to the total volume of the target is 8 vol % or more and 60 vol % or less can be produced. Therefore, by performing sputtering using the FePt—C-based sputtering target according to the second embodiment, a thin film containing an FePt-based alloy and capable of being used as a magnetic recording medium can be formed using only the above target alone, i.e., without using a plurality of targets.

EXAMPLES

Example 1

The targeted composition of a powder mixture, a sintered body and a target in Example 1 is 60.50(50Fe-50Pt)-39.50C. Specifically, the targeted composition of the metal components is 50 at % Fe-50 at % Pt, and the targeted composition ratio of the FePt alloy to C (carbon) is 60.50 at % of the FePt alloy and 39.50 at % of C. When the content of C (carbon) is represented not by at % but by vol %, the targeted composition of the powder mixture and the target in Example 1 is (50Fe-50Pt)-30 vol % C.

First, an Fe atomized powder was produced by a gas atomizing method. The average particle diameter (median diameter) of the obtained Fe atomized powder was 45 μm.

Next, the obtained Fe atomized powder was classified using a sieve with a mesh size of 20 μm, whereby an Fe atomized powder passing through the sieve with a mesh size of 20 μm was obtained.

374.43 g of a Pt powder having an average particle diameter of 1 μm and 30.10 g of amorphous carbon having an average particle diameter 8 μm were added to 107.19 g of the Fe atomized powder passing through the sieve with a mesh size of 20 μm. Then, they were weakly mixed in a tumbler mixer (mixed in the tumbler mixer using balls for 15 minutes) such that the particle diameter of the amorphous carbon was not essentially reduced to thereby obtain a powder mixture for pressure sintering. In the amorphous carbon used, the average particle diameter (median diameter) of the primary particles of C was 8 μm, and the primary particles of C did not form secondary particles.

The obtained powder mixture for pressure sintering was subjected to hot pressing under the conditions of sintering temperature: 1300° C., pressure: 26.2 MPa, time: 60 min, and atmosphere: $5 \times 10^{-2}$ Pa or lower to prepare a sintered body.

The density of the produced sintered body was measured by the Archimedes method, and the measured value was divided by the theoretical density to determine a relative density. The relative density was 92.26%. When the powder mixture for pressure sintering is subjected to pressure sintering to produce a target, part of the C (carbon) reacts with oxygen, so that the composition ratio of the FePt alloy to the C (carbon) in the target obtained slightly deviates from the targeted value. Therefore, the relative density of the sintered body obtained was computed in consideration of the change in the amount of C (carbon) (also in other Examples, Comparative Examples, and Reference Examples in the present description, the relative density was computed in consideration of the change in the amount of C (carbon)).

The structure of the obtained sintered body was observed under a metallurgical microscope. FIG. 1 shows a metallurgical microscope photograph of the sintered body in Example 1 (the magnification of the photograph when it was taken: 1000×, the scale in the photograph: 50 μm). In FIG. 1, dark gray circular portions are amorphous carbon, and light gray portions are the FePt alloy phase. Some black portions (portions indicated by arrows in FIG. 1) are present between circular C phases. These black portions are voids. As is clear from FIG. 1, the C phase portions have an approximately spherical shape in which the value obtained by dividing its major axis by its minor axis is 2 or less.

Next, the obtained sintered body was used to produce a sputtering target having a diameter of 152 mm and a thickness of 2 mm, and the sputtering target was joined to a backing plate having a diameter of 161 mm and a thickness of 4 mm. The sputtering target after joining was set in a sputtering apparatus. Then sputtering was performed at an output of 500 W and an Ar gas pressure in a chamber of 1 Pa, and the number of particles generated was evaluated. Specifically, the sputtering was interrupted at cumulative sputtering times of 15 minutes, 30 minutes, 1 hour, and 2 hours. A circular glass substrate having a diameter of 2.5 inches was set in the sputtering apparatus at each time point, and sputtering was performed for 2 seconds. The cumulative sputtering time is the cumulative time during which the sputtering was performed.

After the sputtering was performed for 2 seconds at each time point, the circular glass substrate having a diameter of 2.5 inches was removed from the sputtering apparatus and set in an optical surface analyzer to count the number of particles. After the sputtering at each time point, the number of particles counted before the sputtering at this time point was subtracted from the number of particles counted at this time point, and the result was used as the number of particles at this time point.

Figure 2:
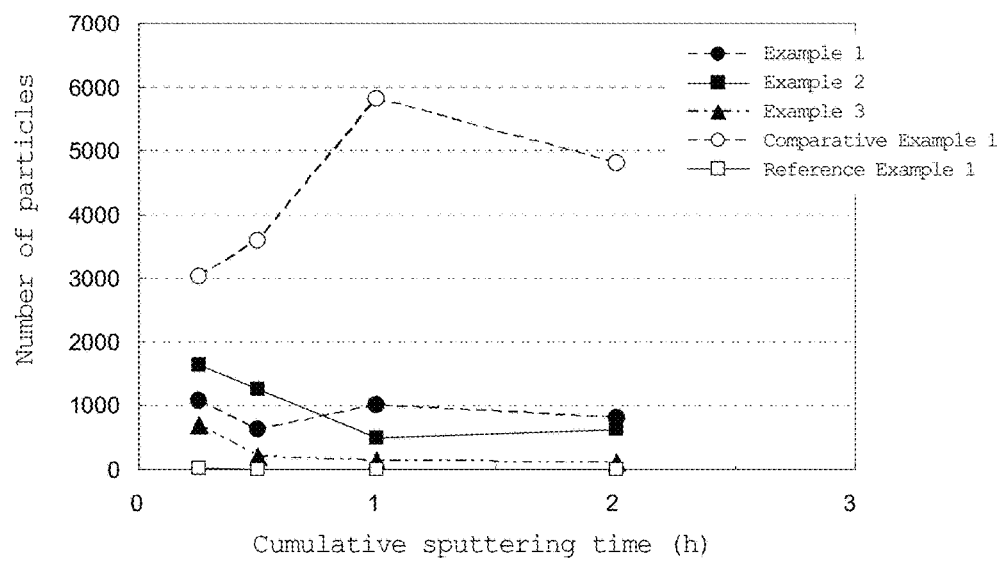
FIG. 2 is a graph showing the relation between cumulative sputtering time and the number of particles generated for each of sputtering targets in Examples 1 to 3, Comparative Example 1, and Reference Example 1.
Figure 3:
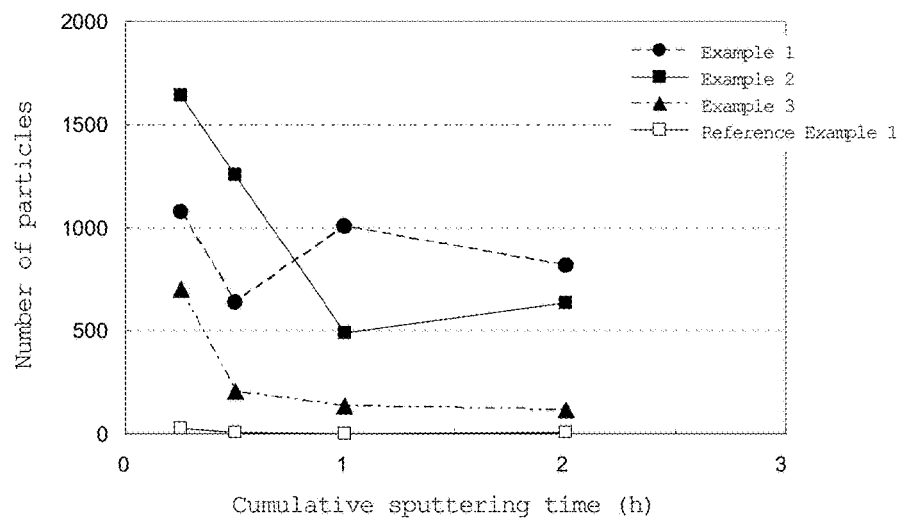
FIG. 3 is a graph showing the relation between cumulative sputtering time and the number of particles generated for each of sputtering targets in Examples 1 to 3 and Reference Example 1.

The numbers of particles at the cumulative sputtering times of 15 minutes, 30 minutes, 1 hour, and 2 hours were 1080, 634, 1005, and 814, respectively. FIGS. 2 and 3 are graphs showing plots of these values. FIGS. 2 and 3 also show the results in other Examples, a Comparative Example, and a Reference Example. The horizontal axis in each of FIGS. 2 and 3 represents the cumulative sputtering time (h), and the vertical axis represents the number of particles. The scales on the vertical axes in FIGS. 2 and 3 are different from each other. The scale on the vertical axis in FIG. 2 is large, and the scale on the vertical axis in FIG. 3 is small.

Example 2

In Example 2, a sintered body and a sputtering target were produced in the same manner as in Example 1 except that 107.19 g of an Fe powder having an average particle diameter of 10 μm was used instead of 107.19 g of the Fe atomized powder used in Example 1.

The relative density of the produced sintered body was measured in the same manner as in Example 1 and was found to be 91.69%.

Figure 4:
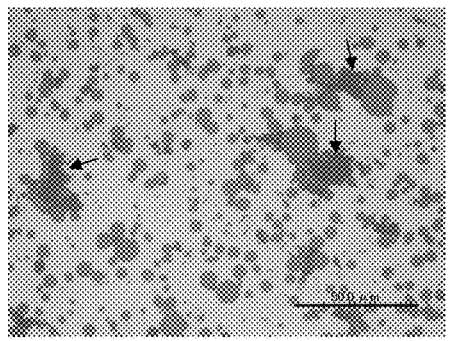
FIG. 4 is a metallurgical microscope photograph of the structure of the sintered body in Example 2 (the magnification of the photograph when it was taken: 1000×, the scale in the photograph: 50 μm).

The structure of the obtained sintered body was observed under a metallurgical microscope. FIG. 4 shows a metallurgical microscope photograph of the sintered body in Example 2 (the magnification of the photograph when it was taken: 1000×, the scale in the photograph: 50 μm). In FIG. 4, dark gray circular portions are amorphous carbon, and light gray portions are the FePt alloy phase. Some black portions (portions indicated by arrows in FIG. 4) are present between circular C phases. These black portions are voids. As is clear from FIG. 4, the C phase portions have an approximately spherical shape in which the value obtained by dividing its major axis by its minor axis is 2 or less.

In Example 2, as in Example 1, the obtained sputtering target was used to perform sputtering, and the number of particles generated was evaluated. The numbers of particles at the cumulative sputtering times of 15 minutes, 30 minutes, 1 hour, and 2 hours were 1643, 1258, 484, and 636, respectively. FIGS. 2 and 3 are graphs showing plots of these values. FIGS. 2 and 3 also show the results in other Examples, a Comparative Example, and a Reference Example.

Example 3

In Example 3, a sintered body and a sputtering target were produced in the same manner as in Examples 1 and 2 except that, after weak mixing was performed in the tumbler mixer such that the particle diameter of the amorphous carbon was not essentially reduced (mixed in the tumbler mixer using balls for 15 minutes), mixing was further performed in a ball mill (at 300 rpm for 30 minutes, cumulative number of revolutions: 9000) to thereby produce the powder mixture for pressure sintering, and that the temperature when the sintered body was produced was changed to 1100° C.

The relative density of the produced sintered body was measured in the same manner as in Example 1 and was found to be 92.10%.

Figure 5:
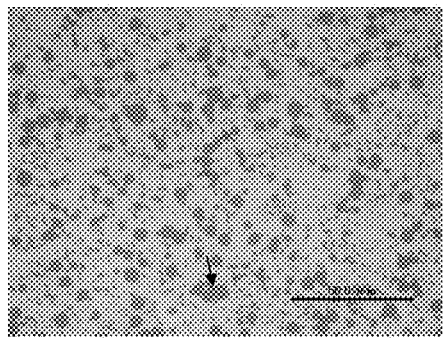
FIG. 5 is a metallurgical microscope photograph of the structure of the sintered body in Example 3 (the magnification of the photograph when it was taken: 1000×, the scale in the photograph: 50 μm).

The structure of the obtained sintered body was observed under a metallurgical microscope. FIG. 5 shows a metallurgical microscope photograph of the sintered body in Example 3 (the magnification of the photograph when it was taken: 1000×, the scale in the photograph: 50 μm). In FIG. 5, dark gray circular portions are amorphous carbon, and light gray portions are the FePt alloy phase. Some black portions (portions indicated by arrows in FIG. 5) are present between circular C phases. These black portions are voids. As is clear from FIG. 5, the C phase portions have an approximately spherical shape in which the value obtained by dividing its major axis by its minor axis is 2 or less.

Unlike Examples 1 and 2 in which only the weak mixing in the tumbler mixer was performed, in Example 3, mixing was performed in the ball mill (at 300 rpm for 30 minutes, cumulative number of revolutions: 9000) in addition to the weak mixing in the tumbler mixer. Therefore, in the photograph of the structure in Example 3 shown in FIG. 5, the number of voids is smaller than those in the photographs of the structures in Examples 1 and 2 shown in FIGS. 1 and 4, but the shape of the amorphous carbon is the same as those in Examples 1 and 2. Thus, it is conceivable that the amorphous carbon having an average particle diameter of 8 μm is hardly pulverized by the mixing in the ball mill at a cumulative number of revolutions of about 9000.

In Example 3, as in Examples 1 and 2, the obtained sputtering target was used to perform sputtering, and the number of particles generated was evaluated. The numbers of particles at the cumulative sputtering times of 15 minutes, 30 minutes, 1 hour, and 2 hours were 701, 203, 135, and 113, respectively. FIGS. 2 and 3 are graphs showing plots of these values. FIGS. 2 and 3 also show the results in other Examples, a Comparative Example, and a Reference Example.

As can be seen from FIGS. 2 and 3, the number of particles generated in Example 3 was equal to or less than those in Examples 1 and 2. This also suggests that the amorphous carbon having an average particle diameter of 8 μm is hardly pulverized by the mixing in the ball mill at a cumulative number of revolutions of about 9000.

Comparative Example 1

The targeted composition of a powder mixture, a sintered body and a target in Comparative Example 1 is 60.50(50Fe-50Pt)-39.50C. Specifically, the targeted composition of the metal components is 50 at % Fe-50 at % Pt, and the targeted composition ratio of the FePt alloy to C (carbon) is 60.50 at % of the FePt alloy and 39.50 at % of C, as in Examples 1 to 3. When the content of C (carbon) is represented not by at % but by vol %, the targeted composition of the powder mixture and the target in Comparative Example 1 is (50Fe-50Pt)-30 vol % C.

First, an FePt alloy atomized powder was produced by a gas atomizing method. The average particle diameter (median diameter) of the obtained FePt alloy atomized powder was 45 μm.

62.50 g of carbon black composed of primary particles having an average particle diameter of about 20 to about 50 nm and forming secondary particles was added to 1000.00 g of the obtained FePt alloy atomized powder, and they were mixed in a ball mill (at 462 rpm for 24 hours, cumulative number of revolutions: 665280) to thereby obtain a powder mixture for pressure sintering. The above mixing was performed to the extent that mechanical alloying occurred, and therefore the FePt alloy atomized powder having a large initial average particle diameter (median diameter) of 45 μm was sufficiently reduced in particle diameter as compared to that before mixing.

The obtained powder mixture for pressure sintering was subjected to hot pressing under the conditions of sintering temperature: 1460° C., pressure: 26.2 MPa, time: 60 min, and atmosphere: $5 \times 10^{-2}$ Pa or lower to prepare a sintered body.

The relative density of the produced sintered body was measured in the same manner as in Example 1 and was found to be 96.12%.

Figure 6:
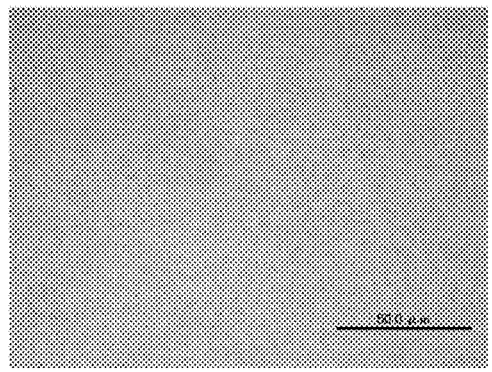
FIG. 6 is a metallurgical microscope photograph of the structure of the sintered body in Comparative Example 1 (the magnification of the photograph when it was taken: 1000×, the scale in the photograph: 50 μm).

The structure of the obtained sintered body was observed under a metallurgical microscope. FIG. 6 shows a metallurgical microscope photograph of the sintered body in Comparative Example 1 (the magnification of the photograph when it was taken: 1000×, the scale in the photograph: 50 μm). As can be seen from FIG. 6, the structure of the sintered body in Comparative Example 1 is much denser than the structures of the sintered bodies in Examples 1 to 3 (FIGS. 1, 4, and 5). In the high-magnification metallurgical microscope photograph (the magnification of the photograph when it was taken: 1000×,) in FIG. 6, C regions are only observed as small dark gray spots. Judging from the scale of the photograph, the size of the small dark gray spots is considered to be equal to or larger than about 0.5 μm. However, the average particle diameter (median diameter) of the primary particles of the carbon black used as the raw material powder is about 20 to about 50 nm. Therefore, it is conceivable that the C dispersed in the FePt alloy phase formed secondary particles.

In Examples 1 to 3, some voids which are black portions (portions indicated by arrows in FIGS. 1, 4, and 5) are present between circular C phases. However, in the structure of the sintered body in Comparative Example 1, such voids are not observed. This may be because, as a result of the mixing performed in the ball mill for a long time, also the FePt alloy atomized powder having a large average particle diameter (median diameter) of 45 μm was sufficiently reduced in size.

Next, the obtained sintered body was used to produce a sputtering target in the same manner as in Examples 1 to 3, and the number of particles generated during sputtering was evaluated in the same manner as in Examples 1 to 3.

The numbers of particles at the cumulative sputtering times of 15 minutes, 30 minutes, 1 hour, and 2 hours were 3019, 3587, 5803, and 4807, respectively. FIG. 2 is a graph showing plots of these values. FIG. 2 also shows the results in other Examples, a Comparative Example, and a Reference Example.

As is clear from FIG. 2, the number of particles generated when the sputtering target in Comparative Example 1 was used to perform sputtering was much larger than those in Examples 1 to 3. In Comparative Example 1, the carbon raw material powder used was carbon black composed of primary particles having a very small average particle diameter (median diameter) of about 20 to about 50 nm and forming secondary particles. Therefore, it is conceivable that the carbon black formed secondary particles also in the FePt alloy phase. The C secondary particles are formed as compressed clusters of primary particles of C, and primary particles of C present inside the secondary particles are not covered with the FePt alloy. Therefore, the primary particles of C present inside the secondary particles may fall off the target as clusters during sputtering to thereby form particles. This may be the reason that the number of particles generated when the sputtering target in Comparative Example 1 was used to perform sputtering was much larger than those in Examples 1 to 3.

In Comparative Example 1, the carbon black used as the C (carbon) raw material powder was mixed with the FePt alloy atomized powder in the ball mill for a long time. Therefore, the carbon black is considered to be reduced in size. Actually, in the high-magnification metallurgical microscope photograph (the magnification of the photograph when it was taken: 1,000×) in FIG. 6, C regions are only observed as small dark gray spots. Judging from the scale of the photograph, the size of the small dark gray spots is considered to be equal to or larger than about 0.5 μm. However, the average particle diameter of the primary particles of the carbon black used as the raw material powder is about 20 to about 50 nm. Therefore, it is conceivable that the carbon black used as the raw material powder formed secondary particles even after the carbon black was mixed in the ball mill for a long time.

Reference Example 1

In Reference Example 1, the targeted composition of a powder mixture, a sintered body, and a target is 50Fe-50Pt. Therefore, the powder mixture, the sintered body, and the target contain no C (carbon) and are composed only of metal components Fe and Pt. This is the difference from Examples 1 to 3 and Comparative Example 1 in which C (carbon) is contained.

178.05 g of an Fe powder having an average particle diameter of 10 μm and 621.95 g of a Pt powder having an average particle diameter of 1 μm were mixed in a tumbler mixer using balls for 15 minutes to thereby obtain a powder mixture for pressure sintering.

The obtained powder mixture for pressure sintering was subjected to hot pressing under the conditions of sintering temperature: 1300° C., pressure: 26.2 MPa, time: 60 min, and atmosphere: $5 \times 10^{-2}$ Pa or lower to prepare a sintered body.

The relative density of the produced sintered body was measured in the same manner as in Example 1 and was found to be 91.10%.

Next, the obtained sintered body was used to produce a sputtering target in the same manner as in Examples 1 to 3 and Comparative Example 1, and the number of particles generated during sputtering was evaluated in the same manner as in Examples 1 to 3 and Comparative Example 1.

The numbers of particles at the cumulative sputtering times of 15 minutes, 30 minutes, 1 hour, and 2 hours were 23, 7, 1, and 8, respectively. FIGS. 2 and 3 are graphs showing plots of these values. FIGS. 2 and 3 also show the results in other Examples, a Comparative Example, and a Reference Example.

As can be seen from FIGS. 2 and 3, the number of particles generated when the target in Reference Example 1 was used to perform sputtering was very small. This may be because the raw material powder includes only metal powders (the Fe powder and the Pt powder) and no C powder is used.

Example 4

The targeted composition of a powder mixture, a sintered body and a target in Example 4 is (50Fe-50Pt)-16.71 mol % C-6.51 mol % $SiO_2$. Specifically, the targeted composition of the metal components is 50 at % Fe-50 at % Pt, and the targeted composition ratio of the Fe, Pt, C (carbon), and $SiO_2$ are 38.39 mol % of Fe, 38.39 mol % of Pt, 16.71 mol % of C, and 6.51 mol % of $SiO_2$. When the contents of C (carbon) and $SiO_2$ are represented not by mol % but by vol %, the targeted composition of the powder mixture and the target in Example 4 is (50Fe-50Pt)-10 vol % C-20 vol % $SiO_2$.

First, an FePt alloy atomized powder was produced by a gas atomizing method. The average particle diameter (median diameter) of the obtained FePt alloy atomized powder was 45 μm.

1020.00 g of the obtained FePt alloy atomized powder and 41.42 g of an $SiO_2$ powder having an average particle diameter of 0.7 μm were mixed in a ball mill (at 462 rpm for 48 hours, cumulative number of revolutions: 1330560) to thereby produce a first powder mixture. When the first powder mixture was produced, mixing was performed in the ball mill for a long time. Therefore, it is conceivable that the FePt alloy atomized powder and the $SiO_2$ powder in the first powder mixture were sufficiently reduced in size.

20.63 g of amorphous carbon having an average particle diameter of 8 μm was added to 990.00 g of the produced first powder mixture, and they were weakly mixed in a tumbler mixer such that the particle diameter of the amorphous carbon was not essentially reduced (mixed in the tumbler mixer using balls for 15 minutes) to thereby obtain a powder mixture for pressure sintering. The amorphous carbon used was the same as that used in Examples 1 to 3 and did not form secondary particles.

The obtained powder mixture for pressure sintering was subjected to hot pressing under the conditions of sintering temperature: 1300° C., pressure: 26.2 MPa, time: 60 min, and atmosphere: $5 \times 10^{-2}$ Pa or lower to prepare a sintered body.

The relative density of the produced sintered body was measured in the same manner as in Example 1 and was found to be 96.55%.

Figure 7:
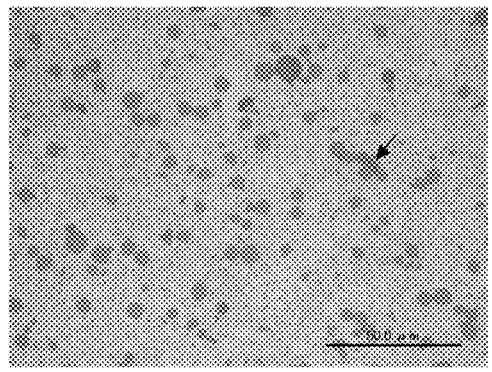
FIG. 7 is a metallurgical microscope photograph of the structure of the sintered body in Example 4 (the magnification of the photograph when it was taken: 1000×, the scale in the photograph: 50 μm).

The structure of the obtained sintered body was observed under a metallurgical microscope. FIG. 7 shows a metallurgical microscope photograph of the sintered body in Example 4 (the magnification of the photograph when it was taken: 1000×, the scale in the photograph: 50 μm). In FIG. 7, dark gray circular portions are amorphous carbon, and light gray portions are the FePt alloy phase. A very small number of black portions (portions indicated by arrows in FIG. 7) are present between circular C phases. These black portions are voids. It is conceivable that, as a result of the mixing performed in the ball mill for a long time, also the FePt alloy atomized powder having a large average particle diameter (median diameter) of 45 μm was sufficiently reduced in size. It is conceivable that the amorphous carbon having a large average particle diameter of 8 μm is easily surrounded by the FePt alloy atomized powder sufficiently reduced in size, but regions not surrounded by the FePt alloy atomized powder may be rarely formed. As is clear from FIG. 7, the C phase portions have an approximately spherical shape in which the value obtained by dividing its major axis by its minor axis is 2 or less.

Next, the obtained sintered body was used to produce a sputtering target in the same manner as in Examples 1 to 3, a Comparative Example 1, and a Reference Example 1, and the number of particles generated during sputtering was evaluated in the same manner as in Examples 1 to 3, a Comparative Example 1, and a Reference Example 1.

Figure 8:
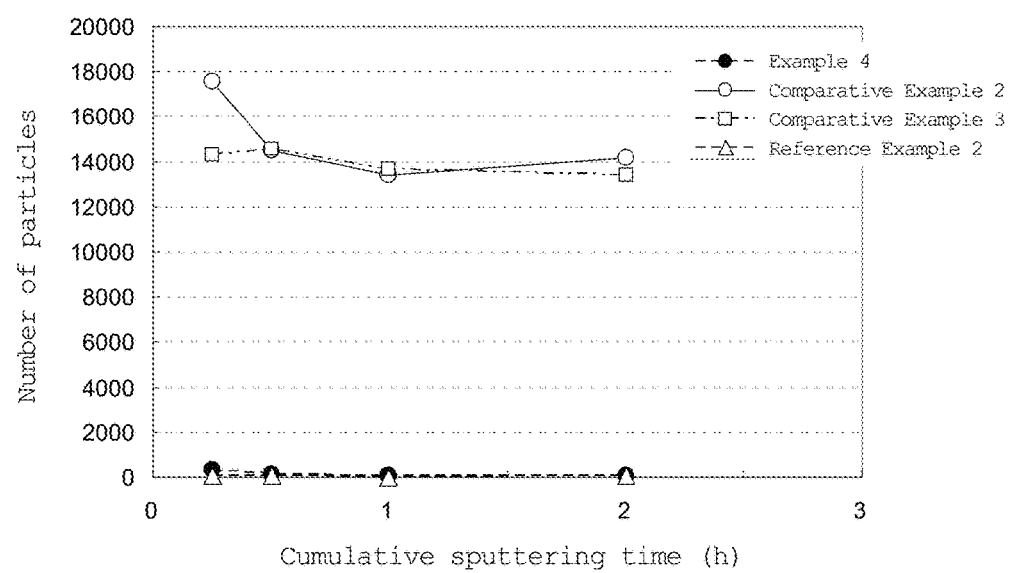
FIG. 8 is a graph showing the relation between cumulative sputtering time and the number of particles generated for each of sputtering targets in Example 4, Comparative Examples 2 and 3, and Reference Example 2.
Figure 9:
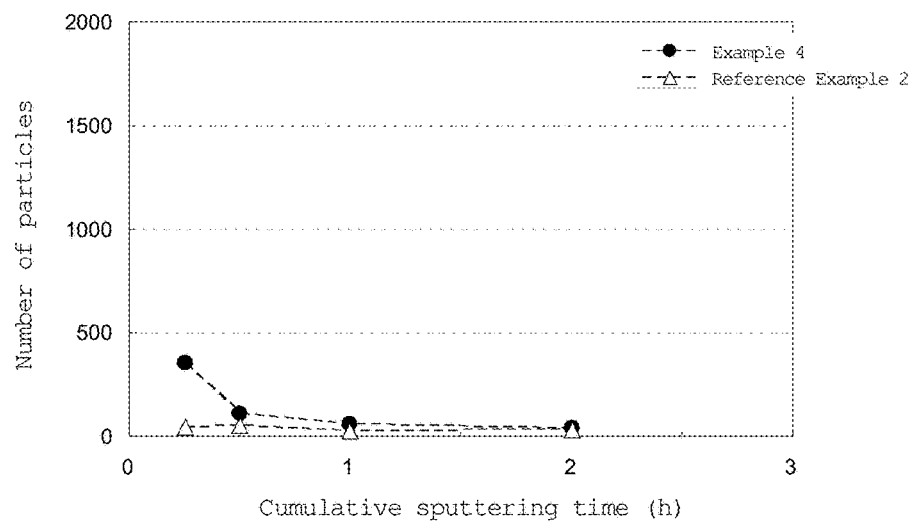
FIG. 9 is a graph showing the relation between cumulative sputtering time and the number of particles generated for each of sputtering targets in Example 4 and Reference Example 2.

The numbers of particles at the cumulative sputtering times of 15 minutes, 30 minutes, 1 hour, and 2 hours were 351, 110, 60, and 38, respectively. FIGS. 8 and 9 are graphs showing plots of these values. FIGS. 8 and 9 also show the results in other Examples, a Comparative Example, and a Reference Example. The horizontal axis in each of FIGS. 8 and 9 represents the cumulative sputtering time (h), and the vertical axis represents the number of particles. The scales on the vertical axes in FIGS. 8 and 9 are different from each other. The scale on the vertical axis in FIG. 8 is large, and the scale on the vertical axis in FIG. 9 is small.

Comparative Example 2

The targeted composition of a powder mixture, a sintered body and a target in Comparative Example 2 is (50Fe-50Pt)-16.71 mol % C-6.51 mol % $SiO_2$, as in Example 4. In Example 4, the FePt alloy atomized powder and the $SiO_2$ powder were first mixed to produce the first powder mixture. Then the amorphous carbon was added to the produced first powder mixture, and they were mixed to produce the powder mixture for pressure sintering. However, as described later, Comparative Example 2 is largely different from Example 4 in that the FePt alloy atomized powder, the carbon black, and the $SiO_2$ powder were mixed at once to produce a powder mixture for pressure sintering.

In Comparative Example 2, as in Examples 4, first, an FePt alloy atomized powder was produced by a gas atomizing method. The average particle diameter (median diameter) of the obtained FePt alloy atomized powder was 45 μm.

1020.00 g of the obtained FePt alloy atomized powder, 21.25 g of carbon black forming secondary particles composed of primary particles having an average particle diameter of 20 to 50 nm, and 41.42 g of $SiO_2$ powder having an average particle diameter of 0.7 μm were mixed in a ball mill (at 462 rpm for 48 hours, cumulative number of revolutions: 1330560) to thereby obtain a powder mixture for pressure sintering. When the powder mixture for pressure sintering was produced, the mixing was performed in the ball mill for a long time, and it is conceivable that the FePt alloy atomized powder in the powder mixture for pressure sintering was sufficiently reduced in size.

The obtained powder mixture for pressure sintering was subjected to hot pressing under the conditions of sintering temperature: 1320° C., pressure: 26.2 MPa, time: 60 min, and atmosphere: $5 \times 10^{-2}$ Pa or lower to prepare a sintered body.

The relative density of the produced sintered body was measured in the same manner as in Example 1 and was found to be 100.08%.

Figure 10:
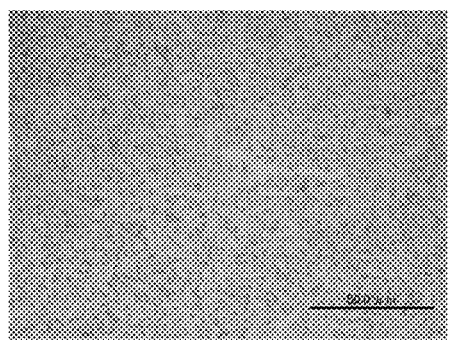
FIG. 10 is a metallurgical microscope photograph of the structure of the sintered body in Comparative Example 2 (the magnification of the photograph when it was taken: 1000×, the scale in the photograph: 50 μm).

The structure of the obtained sintered body was observed under a metallurgical microscope. FIG. 10 shows a metallurgical microscope photograph of the sintered body in Comparative Example 2 (the magnification of the photograph when it was taken: 1000×, the scale in the photograph: 50 μm). As can be seen from FIG. 10, the structure of the sintered body in Comparative Example 2 is much denser than the structures of the sintered body in Example 4 (FIG. 7). In the high-magnification metallurgical microscope photograph (the magnification of the photograph when it was taken: 1000×,) in FIG. 10, C regions are only observed as small dark gray spots. Judging from the scale of the photograph, the size of the small dark gray spots is considered to be equal to or larger than about 1 μm. However, the average particle diameter of the primary particles of the carbon black used as the raw material powder is about 20 to about 50 nm. Therefore, it is conceivable that the C dispersed in the FePt alloy phase formed secondary particles.

In Examples 4, a very small number of voids which are black portions (portions indicated by arrows in FIG. 7) are present between circular C phases. However, in the structure of the sintered body in Comparative Example 2, such voids are not observed.

Next, the obtained sintered body was used to produce a sputtering target in the same manner as in Examples 1 to 4, Comparative Example 1, and Reference Example 1, and the number of particles generated during sputtering was evaluated in the same manner as in Examples 1 to 4, Comparative Example 1, and Reference Example 1.

The numbers of particles at the cumulative sputtering times of 15 minutes, 30 minutes, 1 hour, and 2 hours were 17584, 14466, 13377, and 14167, respectively. FIG. 8 is a graph showing plots of these values. FIG. 8 also shows the results in other Examples, a Comparative Example, and a Reference Example.

In Comparative Example 2, the number of particles generated was significantly larger than that in Example 4.

As is clear from FIG. 8, the number of particles generated when the sputtering target in Comparative Example 2 was used to perform sputtering was much larger than those in Example 4. In Comparative Example 2, the carbon raw material powder used was carbon black composed of primary particles having a very small average particle diameter (median diameter) of about 20 to about 50 nm and forming secondary particles. Therefore, it is conceivable that the carbon black formed secondary particles also in the FePt alloy phase. The C secondary particles are formed as compressed clusters of primary particles of C, and primary particles of C present inside the secondary particles are not covered with the FePt alloy. Therefore, the primary particles of C present inside the secondary particles may fall off the target as clusters during sputtering to thereby form particles. This may be the reason that the number of particles generated when the sputtering target in Comparative Example 2 was used to perform sputtering was much larger than those in Examples 4.

Comparative Example 3

In Comparative Example 3, a sintered body and a sputtering target were produced in the same manner as in Comparative Example 2 except that the carbon raw material used in Comparative Example 2, i.e., 21.25 g of carbon black, was changed to 21.25 g of amorphous carbon and that the temperature when the sintered body was produced was changed to 1,340° C. The amorphous carbon used was the same as that used in Examples 1 to 4 and did not form secondary particles.

The relative density of the produced sintered body was measured in the same manner as in Example 1 and was found to be 98.25%.

Figure 11:
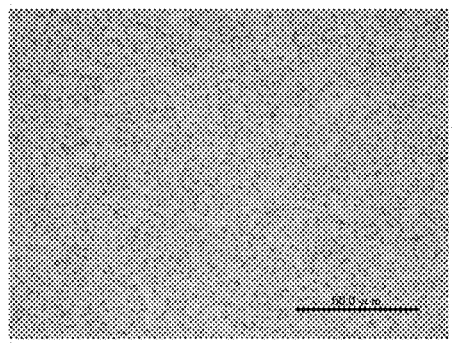
FIG. 11 is a metallurgical microscope photograph of the structure of the sintered body in Comparative Example 3 (the magnification of the photograph when it was taken: 1000×, the scale in the photograph: 50 μm).

The structure of the obtained sintered body was observed under a metallurgical microscope. FIG. 11 shows a metallurgical microscope photograph of the sintered body in Comparative Example 3 (the magnification of the photograph when it was taken: 1000×, the scale in the photograph: 50 μm). As can be seen from FIG. 11, the structure of the sintered body in Comparative Example 3 is much denser, as the sintered body in Comparative Example 2, than the structures of the sintered body in Example 4 (FIG. 7). In the high-magnification metallurgical microscope photograph (the magnification of the photograph when it was taken: 1000×,) in FIG. 11, C regions are only observed as small dark gray spots. In Example 4, a very small number of voids which are black portions (portions indicated by an arrow in FIG. 7) are present between circular C phases. However, in the structure of the sintered body in Comparative Example 3, no such voids are observed.

The structure of the sintered body in Comparative Example 3 (FIG. 11) is similar to the structure of the sintered body in Comparative Example 2 (FIG. 10). It was therefore found that, even when the carbon black composed of primary particles having an average particle diameter (median diameter) of 20 to 50 nm was used as the carbon raw material or even when the amorphous carbon having an average particle diameter of 8 μm was used as the carbon raw material, the obtained sintered body had a similar structure. This may be because, even when the amorphous carbon having an average particle diameter of 8 μm was used, the amorphous carbon was mixed with the FePt alloy atomized powder and the $SiO_2$ particles in the ball mill for a long time and was pulverized sufficiently.

Next, the obtained sintered body was used to produce a sputtering target in the same manner as in Examples 1 to 4, Comparative Examples 1 and 2, and Reference Example 1, and the number of particles generated during sputtering was evaluated in the same manner as in Examples 1 to 4, Comparative Examples 1 and 2, and Reference Example 1.

The numbers of particles at the cumulative sputtering times of 15 minutes, 30 minutes, 1 hour, and 2 hours were 14266, 14562, 13681, and 13404, respectively. FIG. 8 is a graph showing plots of these values. FIG. 8 also shows the results in other Examples, a Comparative Example, and a Reference Example.

As is clear from FIG. 8, in Comparative Example 3 in which the carbon raw material was sufficiently mixed in the ball mill, the number of particle generated during sputtering was significantly larger than that in Example 4 in which the amorphous carbon was mixed such that the particle diameter of the amorphous carbon was not essentially reduced. The carbon raw material used in Comparative Example 3 was the same as the carbon raw material (the amorphous carbon having an average particle diameter of 8 μm) used in Example 4 in which the number of particles generated during sputtering was small. However, when the carbon raw material is mixed sufficiently in the ball mill, it is pulverized, and the average particle diameter of the carbon raw material becomes comparable to the average particle diameter of the carbon black originally having a small average particle diameter (the average particle diameter (median diameter) of the primary particles: about 20 to 50 nm), so that secondary particles are formed. This may be the reason that the number of particles generated during sputtering was large.

Reference Example 2

In Reference Example 2, the targeted composition of a powder mixture, a sintered body, and a target is (50Fe-50Pt)-8.99 mol % $SiO_2$. Specifically, the targeted composition of the metal components is 50 at % Fe-50 at % Pt. This is the same as in Example 4 and Comparative Examples 2 and 3. However, C is not contained, and only $SiO_2$ is contained as a component other than the metals. When the content of $SiO_2$ is represented not by mol % but by vol %, the targeted composition of the powder mixture and the target in Reference Example 2 is (50Fe-50Pt)-25 vol % $SiO_2$.

First, an FePt alloy atomized powder was produced by a gas atomizing method. The average particle diameter (median diameter) of the obtained FePt alloy atomized powder was 45 μm.

1170.00 g of the obtained FePt alloy atomized powder and 55.36 g of $SiO_2$ powder having an average particle diameter of 0.7 μm were mixed in a ball mill (at 462 rpm for 36 hours, cumulative number of revolutions: 997920) to thereby obtain a powder mixture for pressure sintering. When the powder mixture for pressure sintering was produced, the mixing was performed in the ball mill for a long time. Therefore, it is conceivable that the FePt alloy atomized powder and the $SiO_2$ powder in the powder mixture for pressure sintering were sufficiently reduced in size.

The obtained powder mixture for pressure sintering was subjected to hot pressing under the conditions of sintering temperature: 1000° C., pressure: 26.2 MPa, time: 60 min, and atmosphere: $5\times10^{-2}$ Pa or lower to prepare a sintered body.

The relative density of the produced sintered body was measured in the same manner as in Example 1 and was found to be 98.44%.

Figure 12:
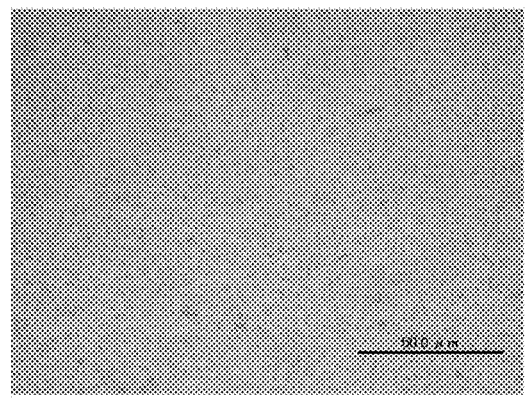
FIG. 12 is a metallurgical microscope photograph of the structure of the sintered body in Reference Example 2 (the magnification of the photograph when it was taken: 1000×, the scale in the photograph: 50 μm).

The structure of the obtained sintered body was observed under a metallurgical microscope. FIG. 12 shows a metallurgical microscope photograph of the sintered body in Reference Example 2 (the magnification of the photograph when it was taken: 1000×, the scale in the photograph: 50 μm). As can be seen from FIG. 12, the structure of the sintered body in Reference Example 2 is much denser than the structures of the sintered body in Example 4 (FIG. 7). In the high-magnification metallurgical microscope photograph (the magnification of the photograph when it was taken: 1000×,) in FIG. 12, $SiO_2$ regions are only observed as small dark gray spots. In Examples 4, a very small number of voids which are black portions (portions indicated by arrows in FIG. 7) are present between circular C phases. However, in the structure of the sintered body in Reference Example 2, such voids are not observed.

Next, the obtained sintered body was used to produce a sputtering target in the same manner as in Examples 1 to 4, Comparative Example 1 to 3, and Reference Example 1, and the number of particles generated during sputtering was evaluated in the same manner as in Examples 1 to 4, Comparative Example 1 to 3, and Reference Example 1.

The numbers of particles at the cumulative sputtering times of 15 minutes, 30 minutes, 1 hour, and 2 hours were 48, 51, 27, and 35, respectively. FIGS. 8 and 9 are graphs showing plots of these values. FIGS. 8 and 9 also show the results in other Examples, a Comparative Example, and a Reference Example.

As is clear from FIGS. 8 and 9, in Reference Example 2 in which no C was contained and only $SiO_2$ was contained as a component other than the metal components, the number of particle generated during sputtering was very small. This may be because the fixing strength of $SiO_2$ to the metals is larger than that of C and atomic bonds in $SiO_2$ are stronger than atomic bonds in C.

(Discussion)

The principal data in Examples 1 to 4, Comparative Examples 1 to 3, and Reference Examples 1 and 2 is summarized in TABLE 1 below.

In Examples 1 to 3, Comparative Example 1, and Reference Example 1, the metal oxide ($SiO_2$) is not contained. In Example 4, Comparative Examples 2 and 3, and Reference Example 2, the metal oxide ($SiO_2$) is contained.

In each of Examples 1 to 3, the composition of the target is 60.50(50Fe-50Pt)-39.50C, and the target has the structure in which the primary particles of C dispersed in the FePt alloy phase do not form secondary particles and are not in contact with each other. Therefore, Examples 1 to 3 fall within the scope of the present invention.

In Comparative Example 1, the composition of the target is 60.50(50Fe-50Pt)-39.50C, as in Examples 1 to 3. However, the primary particles of C dispersed in the FePt alloy phase form secondary particles and are in contact with each other. Therefore, Comparative Example 1 does not fall within the scope of the present invention.

As can be seen from TABLE 1 and FIGS. 2 and 3, in Examples 1 to 3 that fall within the scope of the present invention, the number of particles generated at a cumulative sputtering time of 2 hours is small, i.e., 113 to 814, which is about 1/40 to about 1/6 of the number (4807) of particles generated at the same time point in Comparative Example 1 that does not fall within the scope of the present invention.

In the structures in Examples 1 to 3 that fall within the scope of the present invention, the primary particles of C dispersed in the FePt alloy phase do not form secondary particles and are not in contact with each other. Therefore, it is conceivable that almost the entire circumference of each of the primary particles of C dispersed in the FePt alloy phase is covered with the FePt alloy. This may be the reason

TABLE 1

| | Composition of target | Raw material powders | Number of times of mixing | Mixing method | Sintering temperature (° C.) | Relative density (%) | Number of particles after lapse of 2 hours |
|---|---|---|---|---|---|---|---|
| Example 1 | (50Fe-50Pt)-39.50 at % C | Fe atomized powder (20 μm sieve) Pt powder (1 μm) C powder (8 μm) | 1 time | Weak mixing in tumbler | 1300 | 92.26 | 814 |
| Example 2 | (50Fe-50Pt)-39.50 at % C | Fe powder (10 μm) Pt powder (1 μm) C powder (8 μm) | 1 time | Weak mixing in tumbler | 1300 | 91.69 | 636 |
| Example 3 | (50Fe-50Pt)-39.50 at % C | Fe powder (10 μm) Pt powder (1 μm) C powder (8 μm) | 1 time | Weak mixing in tumbler Ball mill (cumulative number of revolutions: 9000) | 1100 | 92.10 | 113 |
| Comparative Example 1 | (50Fe-50Pt)-39.50 at % C | FePt atomized powder (45 μm) C powder (20-50 nm) | 1 time | Ball mill (cumulative number of revolutions: 665280) | 1460 | 96.12 | 4807 |
| Reference Example 1 | 50Fe-50Pt | Fe powder (10 μm) Pt powder (1 μm) | 1 time | Weak mixing in tumbler | 1300 | 91.10 | 8 |
| Example 4 | (50Fe-50Pt)-16.71 mol % C-6.51 mol % $SiO_2$ | FePt atomized powder (45 μm) C powder (8 μm) $SiO_2$ (0.7 μm) | 2 times | First mixing: Ball mill cumulative number of revolutions: 1330560) Second mixing: Weak mixing in tumbler | 1300 | 96.55 | 38 |
| Comparative Example 2 | (50Fe-50Pt)-16.71 mol % C-6.51 mol % $SiO_2$ | FePt atomized powder (45 μm) C powder (20-50 nm) $SiO_2$ (0.7 μm) | 1 time | Ball mill (cumulative number of revolutions: 1330560) | 1320 | 100.08 | 14167 |
| Comparative Example 3 | (50Fe-50Pt)-16.71 mol % C-6.51 mol % $SiO_2$ | FePt atomized powder (45 μm) C powder (8 μm) $SiO_2$ (0.7 μm) | 1 time | Ball mill (cumulative number of revolutions: 1330560) | 1340 | 98.25 | 13404 |
| Reference Example 2 | (50Fe-50Pt)-8.99 mol % $SiO_2$ | FePt atomized powder (45 μm) $SiO_2$ (0.7 μm) | 1 time | Ball mill (cumulative number of revolutions: 997920) | 1000 | 98.44 | 35 | that the primary particles of C are less likely to fall off the FePt alloy phase during sputtering and particles are less likely to be formed.

However, in Comparative Example 1 that does not fall within the scope of the present invention, the carbon raw material powder used is carbon black composed of primary particles that have a very small average particle diameter (median diameter) of about 20 to about 50 nm and form secondary particles. It is conceivable that secondary particles are formed also in the FePt alloy phase. The C secondary particles are formed as compressed clusters of primary particles of C, and primary particles of C present inside the secondary particles are unlikely to be covered with the FePt alloy. Therefore, these primary particles of C easily fall off the target as clusters during sputtering to thereby form particles.

In Example 4 in which the metal oxide ($SiO_2$) is contained, the composition of the target is 76.78 mol %(50Fe-50Pt)-16.71 mol % C-6.51 mol % $SiO_2$, and the target has the structure in which the primary particles of C dispersed in the FePt alloy phase do not form secondary particles and are not in contact with each other. Therefore, Example 4 falls within the scope of the present invention. In Example 4, the FePt alloy atomized powder having a large average particle diameter of 45 μm is used. However, it is conceivable that the FePt alloy atomized powder is sufficiently reduced in size during the first mixing in which the FePt alloy atomized powder is mixed with the $SiO_2$ added thereto in the ball mill for a long time (mixing before addition of the C powder). Therefore, it is conceivable that the primary particles of C are sufficiently surrounded by the FePt alloy atomized powder during the weak mixing after addition of the C powder. Therefore, it is conceivable that, in the target obtained, the primary particles of C are not in contact with each other and are dispersed in the FePt alloy phase. This may be the reason that the number of particles generated at a cumulative sputtering time of 2 hours in Example 4 was very small, i.e., 38.

In Comparative Examples 2 and 3 in which the metal oxide ($SiO_2$) is contained, the composition of the target is 76.78 mol %(50Fe-50Pt)-16.71 mol % C-6.51 mol % $SiO_2$, as in Example 4. However, the primary particles dispersed in the FePt alloy phase form secondary particles and are in contact with each other. Therefore, Comparative Examples 2 and 3 do not fall within the scope of the present invention. In Comparative Example 3, the amorphous carbon having an average particle diameter of 8 μm is used as the carbon raw material powder, as in Example 4. However, since the amorphous carbon is mixed sufficiently with the FePt atomized powder and the $SiO_2$ powder in the ball mill, the amorphous carbon is pulverized, and the average particle diameter of the amorphous carbon becomes comparable to the average particle diameter of the carbon black originally having a small average particle diameter (the average particle diameter (median diameter) of the primary particles: about 20 to about 50 nm), so that secondary particles are formed. Therefore, it is conceivable that the primary particles of C are not sufficiently surrounded by the FePt alloy atomized powder and the primary particles of C are in contact with each other in the target obtained. This may be the reason that the number of particles generated during sputtering was large.

In Reference Example 2 in which no C is contained and only $SiO_2$ is contained in addition to the metal components, it was found that the number of particles formed during sputtering was very small. This may be because the fixing strength of $SiO_2$ to the metals is larger than that of C and atomic bonds in $SiO_2$ are stronger than atomic bonds in C.

INDUSTRIAL APPLICABILITY

The target according to the present invention can be preferably used as an FePt—C-based sputtering target. The production process according to the present invention can be preferably used as a process for producing an FePt—C-based sputtering target.

The invention claimed is:

1. An FePt—C-based sputtering target containing Fe, Pt, and C, wherein
   the FePt—C-based sputtering target has a structure in which primary particles of C that contain unavoidable impurities are dispersed in an FePt-based alloy phase containing 33 at % or more and 60 at % or less of Pt with the balance being Fe and unavoidable impurities, the primary particles of C being dispersed so as not to be in contact with each other.

2. The FePt—C-based sputtering target according to claim 1, wherein the primary particles have an average particle diameter of 1 μm or more and 30 μm or less.

3. The FePt—C-based sputtering target according to claim 1, wherein the crystal structure of the primary particles of C is an amorphous structure or a diamond structure.

4. The FePt—C-based sputtering target according to claim 1, wherein a volume fraction of the C relative to a total volume of the target is 5 vol % or more and 60 vol % or less.

5. The FePt—C-based sputtering target according to claim 1, wherein a ratio of a surface area of the C that is covered with the FePt-based alloy phase to a total surface area of the C is 80% or more.

6. The FePt—C-based sputtering target according to claim 1, wherein an oxide phase is further dispersed in the FePt-based alloy phase.

7. The FePt—C-based sputtering target according to claim 6, wherein a volume fraction of the C relative to a total volume of the target is 5 vol % or more and less than 60 vol %, a volume fraction of the oxide phase relative to the total volume of the target is 3 vol % or more and less than 55 vol %, and a sum of the volume fractions of the C and the oxide phase relative to the total volume of the target is 8 vol % or more and 60 vol % or less.

8. The FePt—C-based sputtering target according to claim 6, wherein the oxide phase contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

9. The FePt—C-based sputtering target according to claim 1, wherein the primary particles of C have an approximately spherical shape in which a value obtained by dividing a major axis of the approximately spherical shape by a minor axis thereof is 2 or less.

10. The FePt—C-based sputtering target according to claim 1, wherein the FePt-based sputtering target has a relative density of 90% or larger.

11. An FePt—C-based sputtering target containing Fe, Pt, and C and further containing at least one metal element other than Fe and Pt, wherein
    the FePt—C-based sputtering target has a structure in which primary particles of C that contain unavoidable impurities are dispersed in an FePt-based alloy phase containing 33 at % or more and less than 60 at % of Pt and more than 0 at % and 20 at % or less of the at least one metal element other than Fe and Pt with the balance being Fe and unavoidable impurities and with the total amount of Pt and the at least one metal element being 60 at % or less, the primary particles of C being dispersed so as not to be in contact with each other.

12. The FePt—C-based sputtering target according to claim 11, wherein
the at least one metal element other than Fe and Pt are one or more kinds of Cu, Ag, Mn, Ni, Co, Pd, Cr, V, and B.

13. The FePt—C-based sputtering target according to claim 11, wherein the primary particles have an average particle diameter of 1 μm or more and 30 μm or less.

14. The FePt—C-based sputtering target according to claim 11, wherein the crystal structure of the primary particles of C is an amorphous structure or a diamond structure.

15. The FePt—C-based sputtering target according to claim 11, wherein a volume fraction of the C relative to a total volume of the target is 5 vol % or more and 60 vol % or less.

16. The FePt—C-based sputtering target according to claim 11, wherein a ratio of a surface area of the C that is covered with the FePt-based alloy phase to a total surface area of the C is 80% or more.

17. The FePt—C-based sputtering target according to claim 11, wherein an oxide phase is further dispersed in the FePt-based alloy phase.

18. The FePt—C-based sputtering target according to claim 17, wherein a volume fraction of the C relative to a total volume of the target is 5 vol % or more and less than 60 vol %, a volume fraction of the oxide phase relative to the total volume of the target is 3 vol % or more and less than 55 vol %, and a sum of the volume fractions of the C and the oxide phase relative to the total volume of the target is 8 vol % or more and 60 vol % or less.

19. The FePt—C-based sputtering target according to claim 17, wherein the oxide phase contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

20. The FePt—C-based sputtering target according to claim 11, wherein the primary particles of C have an approximately spherical shape in which a value obtained by dividing a major axis of the approximately spherical shape by a minor axis thereof is 2 or less.

21. The FePt—C-based sputtering target according to claim 11, wherein the FePt-based sputtering target has a relative density of 90% or larger.

* * * * *